(12) United States Patent
Rhodes et al.

(10) Patent No.: US 10,450,649 B2
(45) Date of Patent: Oct. 22, 2019

(54) REACTOR FILAMENT ASSEMBLY WITH ENHANCED MISALIGNMENT TOLERANCE

(71) Applicant: GTAT CORPORATION, Merrimack, NH (US)

(72) Inventors: Aaron D Rhodes, Missoula, MT (US); Keith H Ballenger, Missoula, MN (US)

(73) Assignee: GTAT Corporation, Hudson, NH (US)

( * ) Notice: Subject to any disclaimer, the term of this patent is extended or adjusted under 35 U.S.C. 154(b) by 906 days.

(21) Appl. No.: 14/166,879

(22) Filed: Jan. 29, 2014

(65) Prior Publication Data

US 2015/0211111 A1 Jul. 30, 2015

(51) Int. Cl.
C01B 33/035 (2006.01)
C23C 16/24 (2006.01)
C23C 16/44 (2006.01)

(52) U.S. Cl.
CPC ............ C23C 16/24 (2013.01); C01B 33/035 (2013.01); C23C 16/4418 (2013.01)

(58) Field of Classification Search
CPC .... C23C 16/24; C23C 16/4418; C01B 33/035
USPC ........................................................ 427/248
See application file for complete search history.

(56) References Cited

U.S. PATENT DOCUMENTS

| 3,058,812 | A | | 10/1962 | Ting Li Chu et al. |
| 3,635,757 | A | | 1/1972 | Harris |
| 3,647,530 | A | | 3/1972 | Dyer |
| 3,746,496 | A | * | 7/1973 | Dietze ................. C23C 16/01 425/447 |
| 3,962,391 | A | * | 6/1976 | Dietze ................. C23C 16/01 264/81 |
| 4,062,714 | A | * | 12/1977 | Griesshammer ........ C23C 16/22 156/304.6 |
| 4,150,168 | A | | 4/1979 | Yatsurugi et al. |
| 4,173,944 | A | | 11/1979 | Koppi et al. |
| 4,520,487 | A | * | 5/1985 | Graniou .................. H05B 3/66 338/279 |
| 4,579,080 | A | | 4/1986 | Martin et al. |

(Continued)

FOREIGN PATENT DOCUMENTS

EP 0045191 A1 2/1982
EP 0529593 A1 3/1993

(Continued)

OTHER PUBLICATIONS

PCT Search Report dated Apr. 20, 2010 of Patent Application No. PCT/US2009/003763 filed Jun. 23, 2009, 6 pages.

(Continued)

*Primary Examiner* — Charlee J C Bennett
(74) *Attorney, Agent, or Firm* — Maine Cernota & Rardin

(57) ABSTRACT

A tubular filament assembly for a CVD silicon deposition reactor is disclosed that provides consistent, low resistance connections to vertical tubular filaments by forming slidable connections between upper and/or lower ends of the tubular filaments and shaped elements cooperative with the bridge and/or the support chucks, so that the connections are insensitive at least to small variations in tilt angle of the vertical filaments and/or the horizontal bridge. The shaped elements can be incorporated into or separate and cooperative with the bridge and/or the chucks. Various embodiments are described.

35 Claims, 25 Drawing Sheets

(56) References Cited

U.S. PATENT DOCUMENTS

| | | | |
|---|---|---|---|
| 4,686,465 A * | 8/1987 | Kruger | G01R 1/07371 324/756.03 |
| 2,805,565 A | 2/1989 | Racek et al. | |
| 4,805,556 A | 2/1989 | Hagan et al. | |
| 4,837,052 A | 6/1989 | Lorimer | |
| 5,064,367 A | 11/1991 | Philipossian | |
| 5,108,512 A | 4/1992 | Goffnett | |
| 5,284,640 A | 2/1994 | Jernegan et al. | |
| 5,327,454 A | 7/1994 | Ohtsuki et al. | |
| 5,885,358 A | 3/1999 | Maydan et al. | |
| 6,221,155 B1 | 4/2001 | Keck et al. | |
| 6,284,312 B1 | 9/2001 | Chandra et al. | |
| 6,319,556 B1 | 11/2001 | Olsen | |
| 6,362,095 B1 | 3/2002 | Woo et al. | |
| 6,639,192 B2 | 10/2003 | Hertlein | |
| 6,716,302 B2 | 4/2004 | Carducci et al. | |
| 6,872,259 B2 | 3/2005 | Strang | |
| 6,902,622 B2 | 6/2005 | JohnsQard et al. | |
| 7,217,336 B2 | 5/2007 | Strang | |
| 7,323,047 B2 | 1/2008 | Sugawara et al. | |
| 8,366,892 B2 | 2/2013 | Kraus et al. | |
| 2003/0104202 A1 | 6/2003 | Keck | |
| 2006/0185589 A1 | 8/2006 | Zehavi et al. | |
| 2006/0196603 A1 | 9/2006 | Lei et al. | |
| 2007/0187363 A1 | 8/2007 | Oka et al. | |
| 2007/0251455 A1 * | 11/2007 | Wan | C01B 33/035 118/724 |
| 2009/0269493 A1 | 10/2009 | Mizuno | |
| 2010/0122657 A1 | 5/2010 | Hsieh | |
| 2011/0036292 A1 | 2/2011 | Dehtiar et al. | |
| 2011/0159214 A1 | 6/2011 | Gum et al. | |
| 2011/0203101 A1 * | 8/2011 | Gum | C01B 33/035 29/458 |
| 2011/0271718 A1 | 11/2011 | Wan | |
| 2011/0318909 A1 | 12/2011 | Gum et al. | |

FOREIGN PATENT DOCUMENTS

| | | |
|---|---|---|
| EP | 1162652 A2 | 12/2001 |
| GB | 1131462 | 10/1986 |
| JP | 61-281009 | 12/1986 |
| JP | 02-006317 | 10/1990 |
| RU | 2023050 C1 | 11/1994 |
| RU | 2125620 C1 | 1/1999 |
| WO | 1999031013 | 6/1999 |
| WO | 2006091413 | 8/2009 |

OTHER PUBLICATIONS

International Preliminary Report on Patentability for PCT/US2009/003763 dated Jan. 5, 2011, 10 pages.

English translation of First Office action in counterpart Chinese Patent Application No. 200980123874.3 dated Aug. 22, 2012, 18 pages.

English translation of Second Office action in counterpart Chinese Patent Application No. 200980123874.3 dated Mar. 19, 2013, 12 pages.

English translation of Third Office action in counterpart Chinese Patent Application No. 200980123874.3 dated Oct. 17, 2013, 11 pages.

Taiwan Search Report for Taiwan Application No. 98120960 dated Jun. 27, 2014, 4 pages.

International Preliminary Report on Patentability of PCT/US2015/013206, dated Aug. 2, 2016, 9 pages.

PCT Search Report for PCT Application No. PCT/US2015/013206, dated May 21, 2015, 10 pages.

* cited by examiner

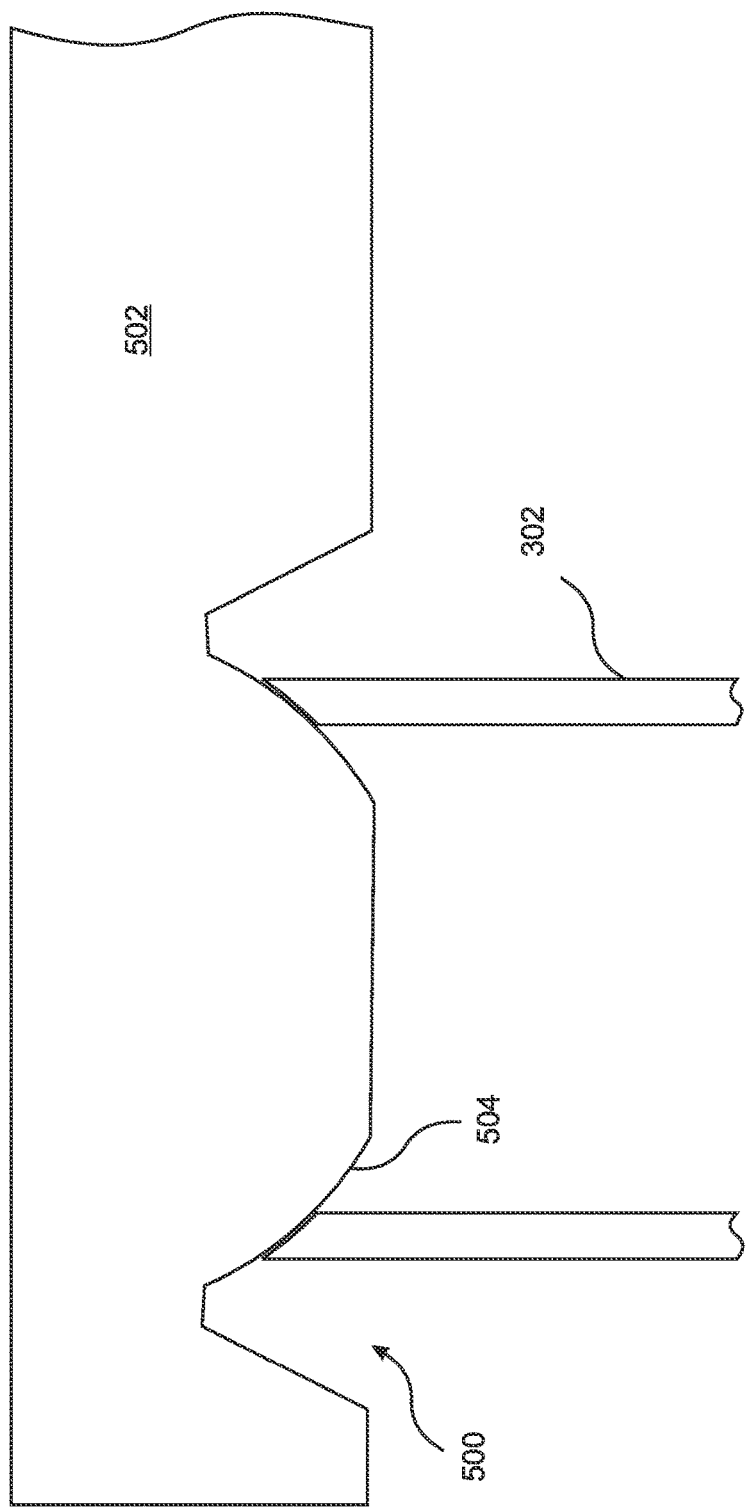

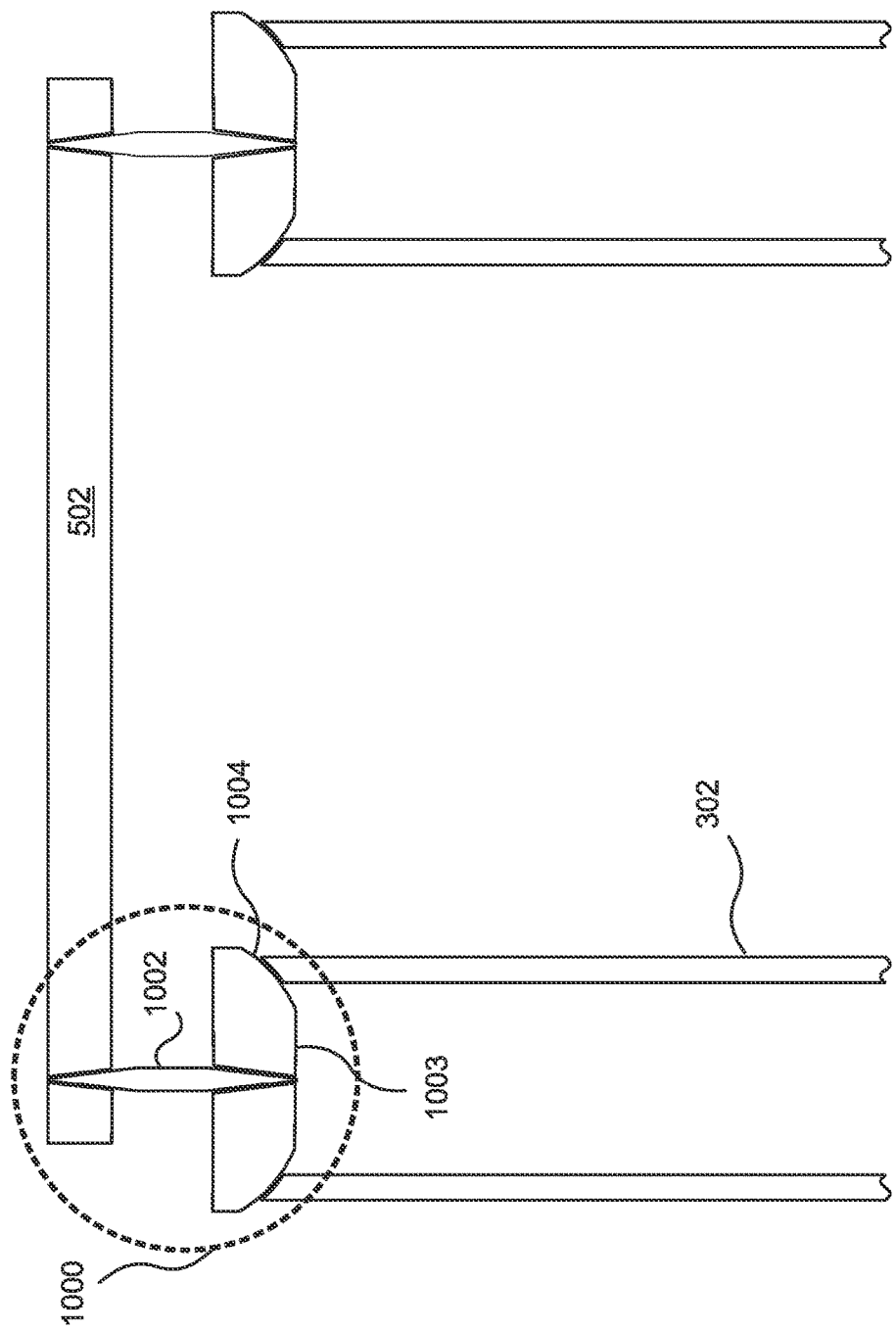

Fig. 12E SECTION A-A

REACTOR FILAMENT ASSEMBLY WITH ENHANCED MISALIGNMENT TOLERANCE

FIELD OF THE INVENTION

The invention relates to silicon deposition CVD reactors, and more particularly, to CVD reactors that use vertical silicon tube filaments.

BACKGROUND OF THE INVENTION

Chemical vapor deposition (CVD) is a chemical process used to produce high-purity, high-performance solid materials. The process is often used in the semiconductor and photovoltaic industries to produce high quality silicon materials. In a conventional CVD process, a rod structure is exposed to one or more volatile precursors, which react and/or decompose on the rod surface to produce the desired deposit. Frequently, volatile byproducts are also produced, which can be removed by gas flow through a reaction chamber in the CVD reactor.

One method used to produce solid materials such as polysilicon by deposition in a chemical vapor deposition reactor is known as the Siemens method. When producing polysilicon using the Siemens method, polysilicon is deposited in a CVD reactor on one or more high-purity thin silicon rods, also known as "slim rods." Typically, the slim rods must be heated to an elevated temperature to enable the deposition. According to the Siemens method, electrical current is passed through the slim rods to raise their temperature to approximately 1000° C., and in some cases to a temperature as high as 1200° C.

Because these slim rods are fabricated from high-purity silicon, the corresponding electrical resistance of the slim rods at room temperature is extremely high. Thus, a very high initial voltage is required to initiate the electric current during the startup phase of the CVD process. Typically, a high voltage on the order of thousands of volts is initially applied to the rods. Due to this high voltage, a small current can begin to flow through the slim rods. This current generates heat in the slim rods, reducing the electrical resistance of the rods, and permitting yet higher current flow which generates additional heat. As the rods heat up to the desired temperature, the applied voltage is correspondingly reduced.

A typical "Siemens" type polysilicon CVD reactor is illustrated in FIG. 1, reproduced from FIG. 1 of U.S. Pat. No. 6,284,312 which is incorporated in its entirety by reference herein. Generally, polysilicon rods are produced in a Siemens CVD reactor 100 by the pyrolytic decomposition of a gaseous silicon compound, such as mono-silane or a chlorosilane (e.g., trichlorosilane), onto the silicon slim rod, also referred to as the starter "filament." The CVD reactor 100 includes a reaction chamber 24 defined by or having a baseplate 23 and an enclosure, often referred to as a "bell jar" 17 securable to the base plate 23. The bell jar 17 can be comprised of quartz, and/or of a metal such as any of the various grades of stainless steel alloys.

In the example shown in FIG. 1, the chamber contains an assembly of slim rod filaments in a hairpin configuration in the form of two vertical filaments 11, which are connected by a horizontal bridge 12. The filaments are heated by passing electrical current through them while being exposed to a silicon-containing gas, thereby causing silicon 13 to be deposited onto the filaments. Also, electrical feed throughs 19 and a gas inlet and outlet 20 and 21, respectively, can be incorporated into the base plate 23. A viewing port 22 can provide for visual inspection of the interior.

Connections between traditional slim rod filaments in a CVD reactor, and between the vertical filaments 11 and corresponding support chucks, are important to maintaining electrical connections in the reactor 100. With regard to the chuck-to-filament connections, known attachment mechanisms utilize screws, bolts, clamps, etc. Known connections between vertical filaments 11 and horizontal bridge 12 are formed with a groove or a key slot at the top of each vertical rod. A small counter bore or conforming figment can be formed on the ends of the horizontal bridge 12 so that it can be press fitted into the grooves to bridge the two vertical slim rods 11.

With reference to FIGS. 2A and 2B, and as described in U.S. Pat. No. 6,284,312, large diameter vertical silicon tube filaments have been utilized in place of slim rods. In FIGS. 2A and 2B, the vertical filaments 11 of FIG. 1 are replaced by vertical cylindrical tube filaments 200, which are joined by a flat silicon bridge 202 that rests on the tops of the vertical tube filaments 200. FIG. 2A illustrates the tubular filament assembly with the bridge 202 lifted off of the tubes 200 for clarity of illustration, while FIG. 2B illustrates the apparatus of FIG. 2A with the bridge 202 resting on the tops of the vertical tubes 200.

Tube filaments provide several advantages over traditional slim rod filaments. Due to the higher surface area of the tubular filaments 200, silicon is deposited at a faster rate. Also, under ideal conditions, an increased overall surface area of connection between the tube filaments provides decreased resistance at the connections, so that the total resistance that must be initially overcome is lower. Therefore, a lower voltage is necessary to induce current flow through a tube filament hairpin configuration, as shown in FIG. 2B, as compared to a conventional slim rod hairpin configuration, as shown in FIG. 1.

However, conditions are not always ideal. For example, the filament tops may not be cut exactly flat or perpendicular to their centerlines. In addition, the filaments may not be exactly the same height. Lab testing in a CVD reactor of hairpin filament assemblies formed by two vertical cylinders of silicon joined at the top by a flat silicon bridge has shown that maintaining adequate electrical connection between the components of the hairpin assembly is sometimes difficult, often as a result of these imperfections. The connection method works best if the tops of the tubes are in exactly the same plane. Any variance from this can cause the bridge to lose its flat face-to-face connection, so that the bridge rests only on point contacts on one or both tubes. As a result, electrical current will tend to flow only at the points of contact between the tube tops and the bridge, leading to higher resistance and possible local heating issues.

FIG. 2C is a side view of the hairpin filament assembly of FIG. 2A shown under ideal circumstances. FIG. 2D illustrates the same filament assembly, shown with the right-hand vertical cylinders tilted by 2°. Note how the flat bridge 202 in FIG. 2D makes contact only with a small portion of the top of the right-hand cylinder. Similarly, FIG. 2E is a side view of the filament assembly of FIG. 2A when one of the cylinders is about 1.5% longer than the other. Once again, the flat bridge 202 contacts only a portion of the top of the longer cylinder. In addition, the flat bridge 202 contacts only a portion of the top of the shorter cylinder.

Under such non-ideal conditions, caused by very small imperfections, the resistance of the bridge-to-cylinder connections is greatly increased. If the power supply is configured to provide only enough voltage to heat the filament under ideal conditions, then when a non-ideal condition such as FIG. 2D or FIG. 2E arises the power supply may not be able to provide enough voltage to initiate the filament heating process.

Furthermore, under such non-ideal conditions, the distribution of the current proximal to the bridge-to-cylinder connections is highly uneven, which leads to uneven heating and thermal stresses, as well as uneven deposition of silicon in the connection region, thereby reducing the strength and longevity of the connection. The additional thermal stresses can even result in failure of the bridge and premature termination of the silicon deposition process.

What is needed, therefore, is a tubular filament assembly for a CVD silicon deposition reactor that provides consistent, low resistance connections between the elements of a filament assembly.

SUMMARY OF THE INVENTION

The present invention is a tubular filament assembly for a CVD silicon deposition reactor that provides consistent, low resistance connections between the elements of the filament assembly by including a shaped element in either connection, so that the connection is insensitive at least to small variations in the tilt angle of the vertical cylinders and/or of the horizontal bridge. As a result, the resistance of the cylinder-to-bridge connection is reduced, and the current is more uniformly distributed in the region of the cylinder-to-bridge connection, which leads to more uniform heating and thermal stresses, as well as a more uniform deposition of silicon in the connection region, thereby increasing the strength and longevity of the connection.

The shaped element can be cooperative with the silicon bridge, or with a chuck. The shaped element can be shaped as a section of a sphere, or can be beveled or chamfered in a manner that approximates a spherical section.

One general aspect of the invention is a CVD reactor for bulk production of polysilicon that includes a base plate configured with a first filament support chuck and a second filament support chuck; an enclosure attachable to said base plate so as to form a deposition chamber; and a filament assembly. The filament assembly comprises a first tubular silicon filament, said first tubular silicon filament being vertically oriented and having a bottom end making an electrical connection with said first filament support chuck; a second tubular silicon filament, said second tubular silicon filament being vertically oriented and having a bottom end making an electrical connection with said second filament support chuck; a horizontal bridge configured for electrically connecting top ends of said first and second silicon tube filaments; and a shaped element having a peripheral surface surrounding a central axis of the shaped element. The peripheral surface of the shaped element is slanted or curved so as to form a slidable region of contact around a perimeter of said top end or said bottom end of said first tubular silicon filament when said peripheral surface is placed adjacent to said top end or said bottom end of the first tubular silicon filament, said peripheral surface being configured to maintain at least 50% of said region of contact when an angle between the central axes of the shaped element and a central axis of the first tubular silicon filament is varied up to a maximum tilt angle.

Another general aspect of the present invention is the filament assembly configured for bulk production of polysilicon in the CVD reactor of the present invention.

Yet another general aspect of the present invention is a horizontal filament bridge configured for electrically connecting top ends of a first vertical tubular silicon filament and a second vertical tubular silicon filament of the filament assembly used in the CVD reactor of the present invention. The horizontal filament bridge includes a horizontal bridge and a shaped element proximal to a first end of the horizontal bridge, the shaped element having a peripheral surface surrounding a central axis of the shaped element, said peripheral surface being slanted or curved so as to form a slidable, region of contact around a perimeter of said top of the first tubular silicon filament when said outer peripheral surface is placed on top of said first tubular silicon filament, said peripheral surface being configured to maintain at least 50% of said region of contact when an angle between the central axes of the shaped element and a central axis of the first tubular silicon filament is varied up to a maximum tilt angle.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 5A is a side view of a connection between a flat horizontal bridge and the top of a vertical filament in an embodiment where a circular, curved groove is formed in the horizontal bridge, and the inwardly chamfered top of the vertical filament rests against the inner wall of the circular groove;

FIG. 10A is a side view of a pair of vertical filaments with the curved outer walls of shaped elements resting on their inwardly chamfered tops, the shaped elements being connected to a horizontal bridge by separate interconnecting pieces;

DETAILED DESCRIPTION

The present invention is a tubular filament assembly design for a CVD silicon deposition reactor that provides consistent, low resistance connections between the filament components by including a shaped element in either or both connections, preferably each connection. In this way, the connection is insensitive at least to small variations in the tilt angle of the filament components, such as the vertical filament and/or of the horizontal bridge. The shaped element can be cooperative with the bridge, or with a chuck supporting the filament.

Figure 1:
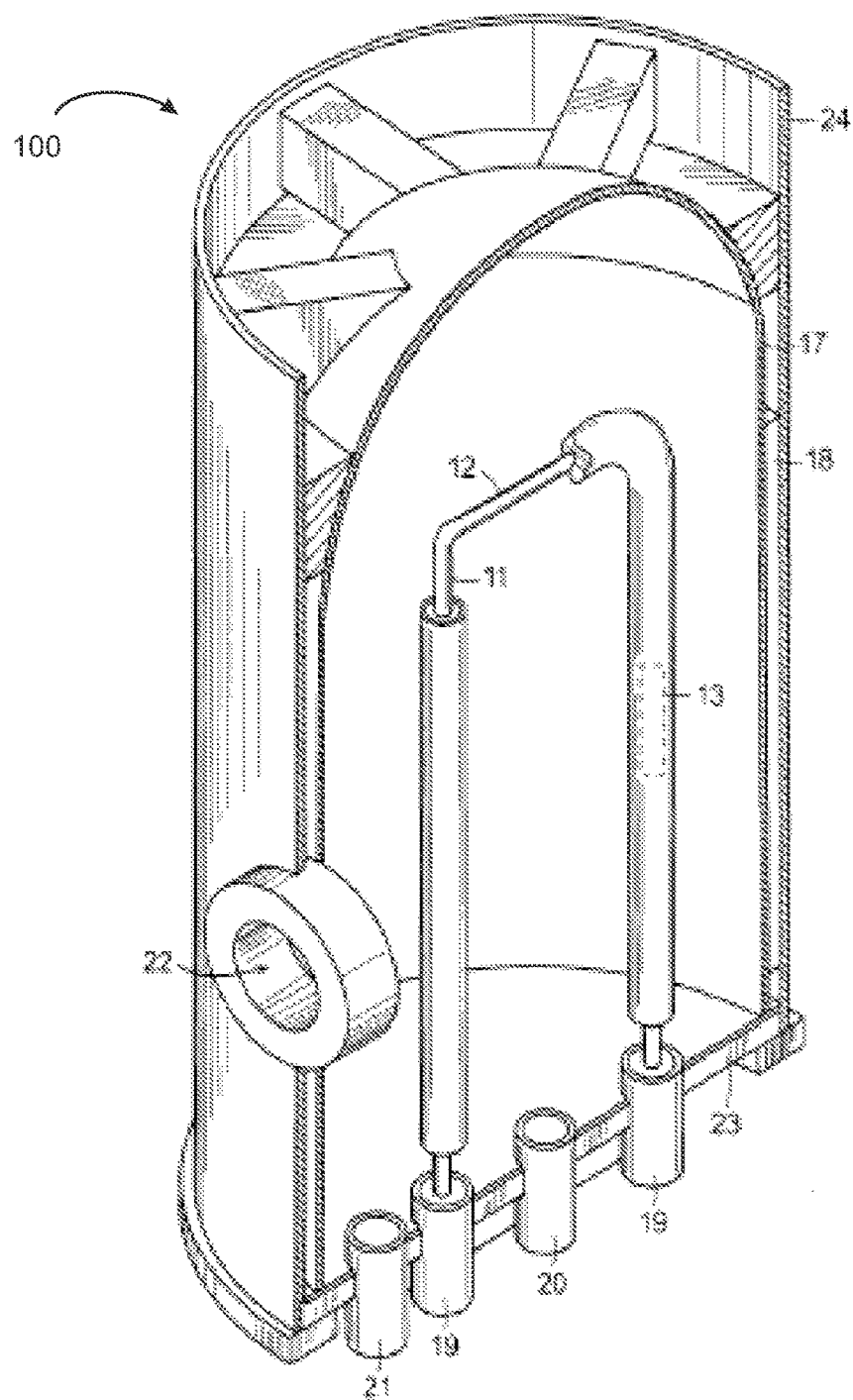
FIG. 1 is a cutaway drawing illustrating a Siemens CVD silicon deposition reactor of the prior art.
Figure 2A:
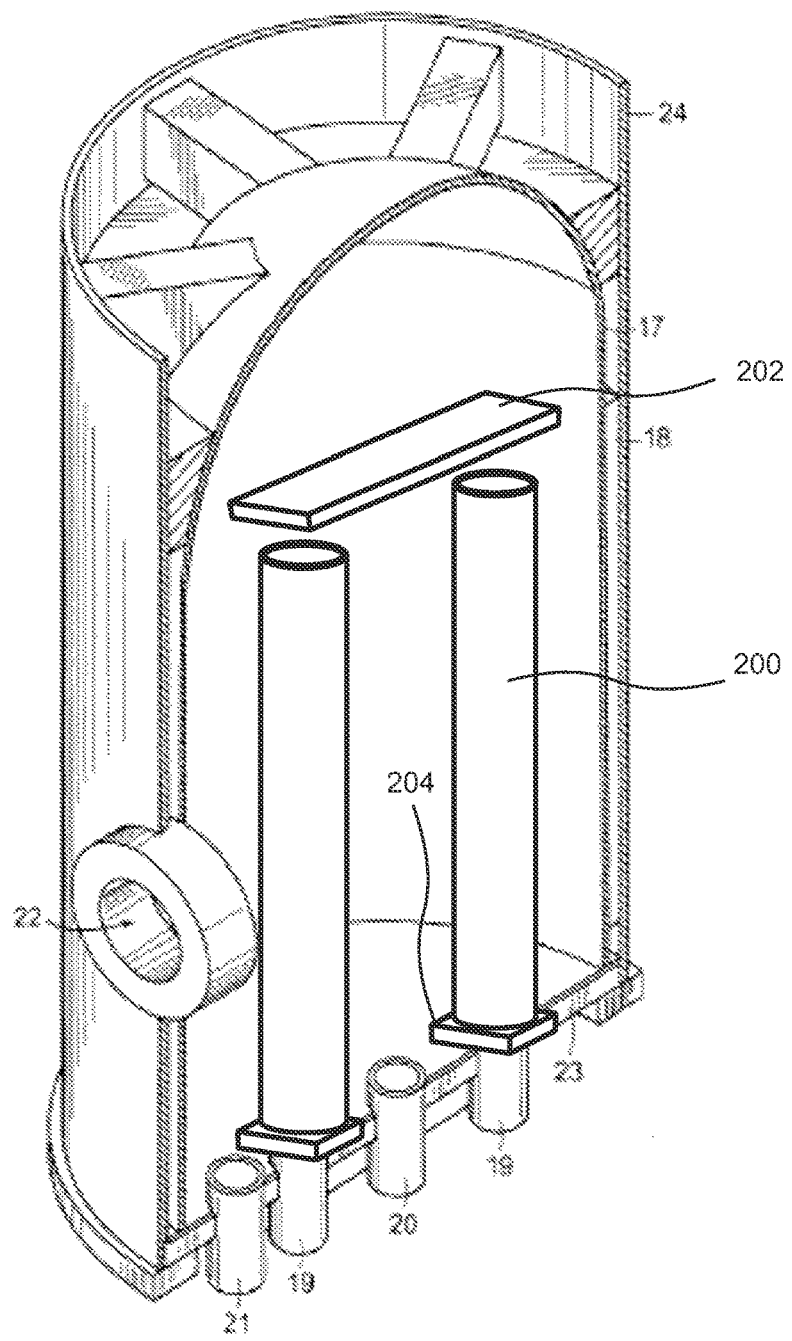
FIG. 2A is a cutaway drawing of a CVD reactor similar to FIG. 1, but including a silicon filament assembly formed by two vertical filaments and a flat horizontal bridge, the horizontal bridge being lifted above the vertical filament for clarity of illustration.
Figure 2B:
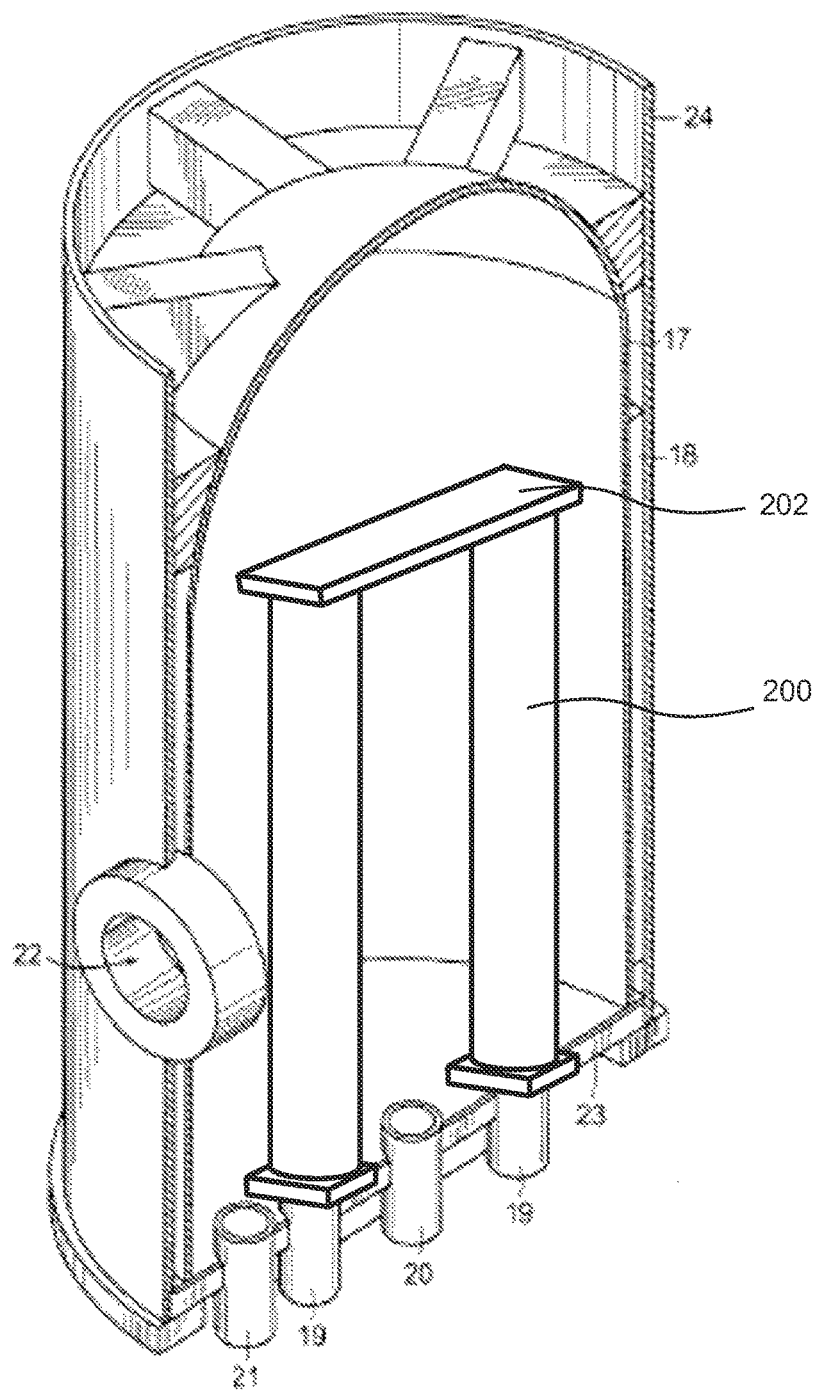
FIG. 2B is a cutaway drawing similar to FIG. 2A, but showing the flat horizontal bridge resting on the tops of the vertical filaments.
Figure 2C:
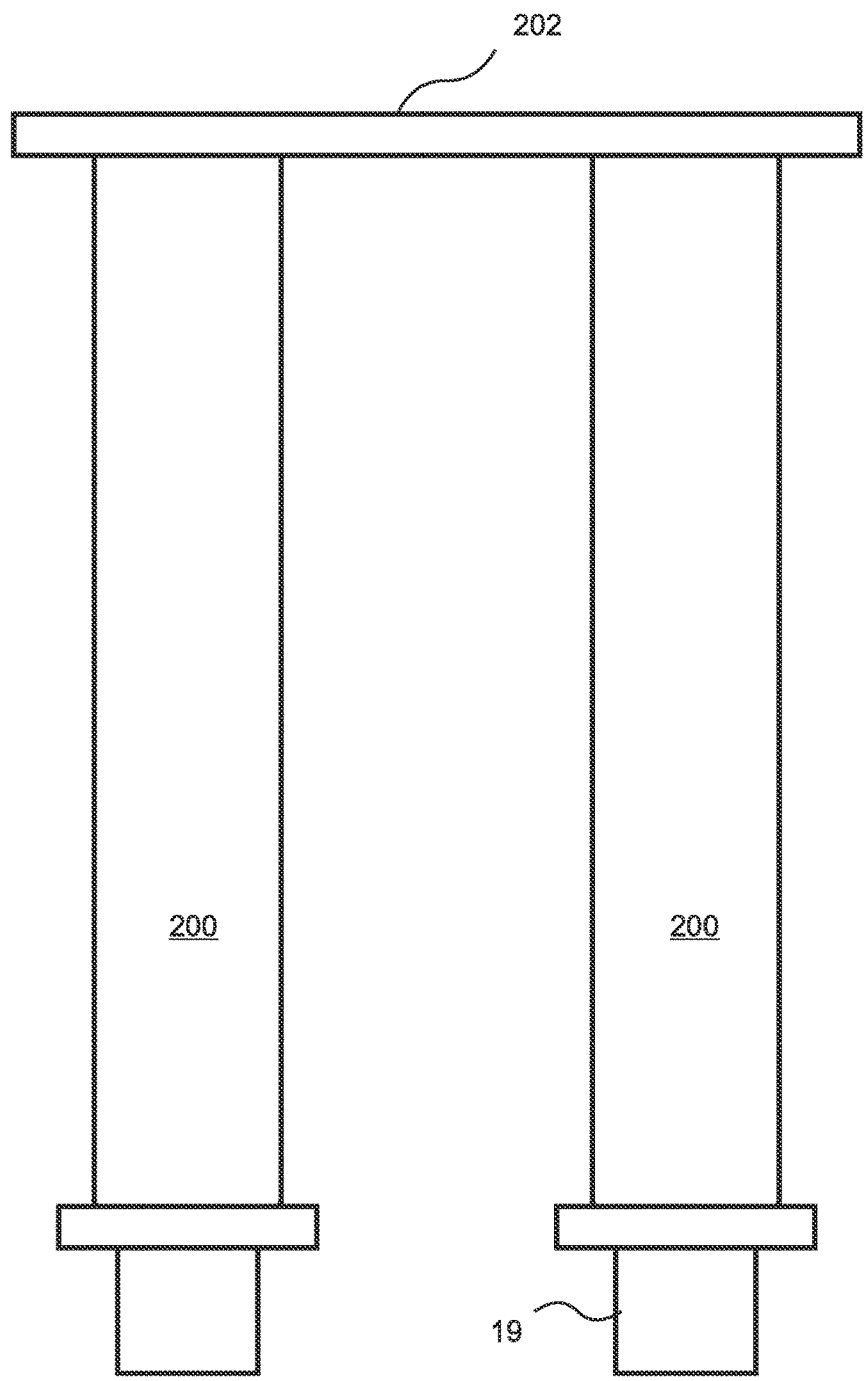
FIG. 2C is a side view of the silicon filament assembly of FIG. 2B under ideal conditions.
Figure 2D:
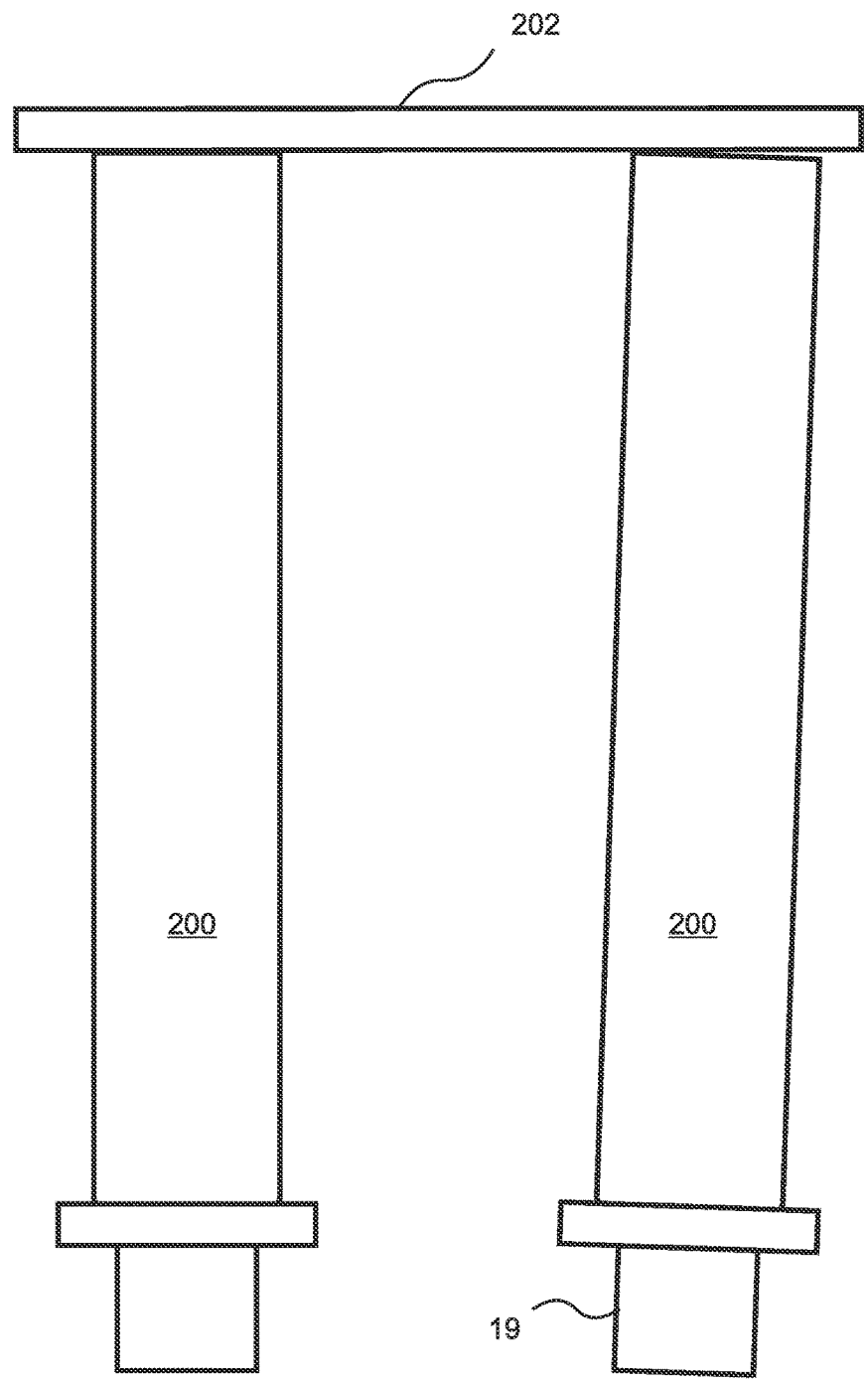
FIG. 2D is a side view of the silicon filament assembly of FIG. 2B under non-ideal conditions where one of the filaments is tipped by 2 degrees.
Figure 2E:
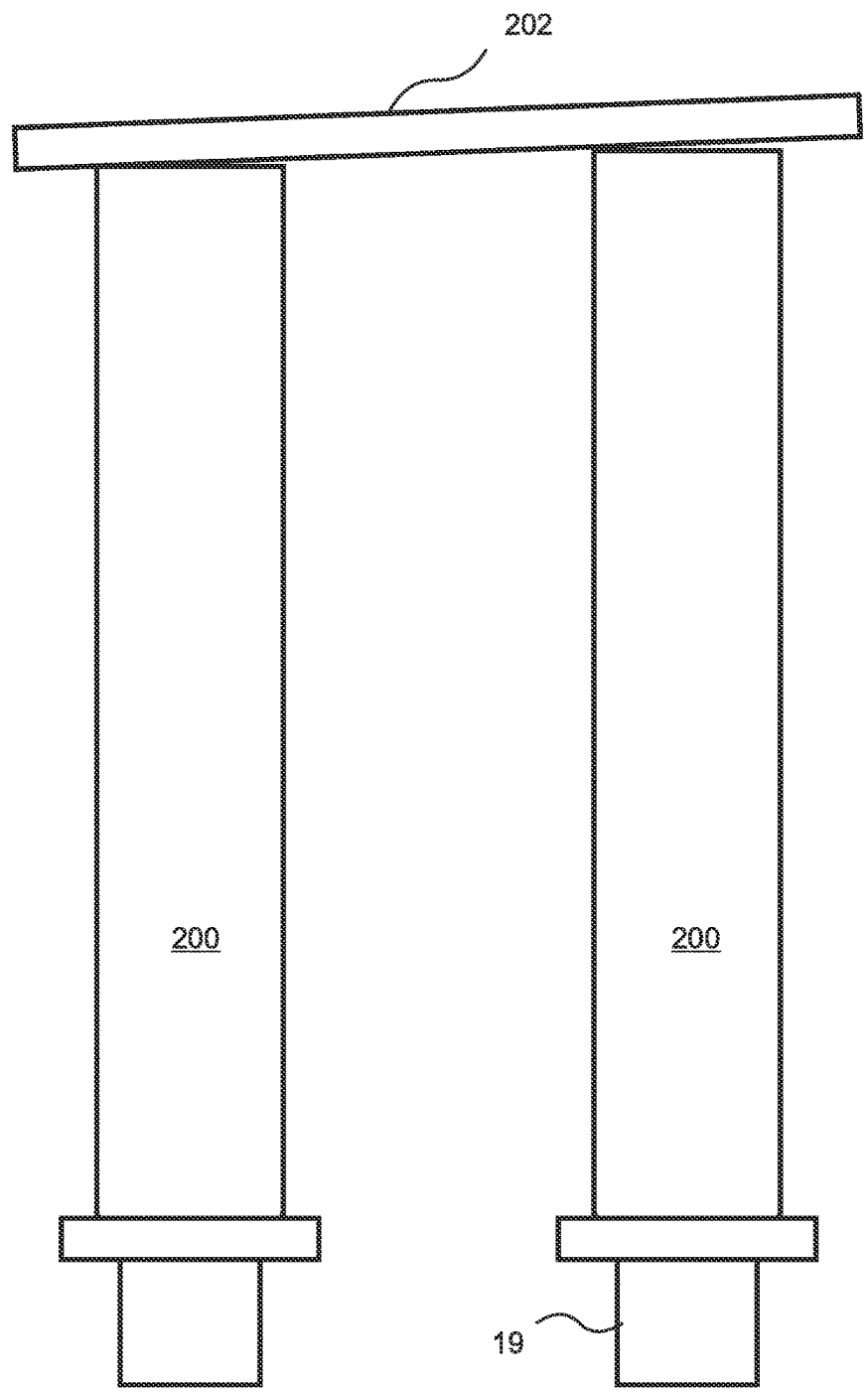
FIG. 2E is a side view of the silicon filament assembly of FIG. 2B under non-ideal conditions where one of the filaments is approximately 1.5% longer than the other.

The CVD reactor of the present invention includes components also found inthe reactor shown in FIG. 2A. Electrical feedthroughs 19 are incorporated in the base plate 23, and a gas inlet 20 and a gas outlet 21 are included. In embodiments they are incorporated into the base plate 23. Some embodiments further include a viewing port 22 that provides for visual inspection of the interior. In various embodiments the enclosure 17 is a quartz bell jar, and the reactor can further include a chamber cover 24, bell jar supports 16, and a heater 18 between the bell jar and the chamber cover 24.

The reactor of the present invention also includes a filament assembly that comprises two hollow vertical filaments supported by filament support chucks. The vertical filaments are connected at their tops by a horizontal bridge. In some embodiments, the vertical filaments are hollow cylinders. A power supply can be electrically connected through the support chucks to the vertical filaments and can be configured to supply an appropriate amount of current to initialize and maintain electrical heating of the vertical filaments.

Figure 3:
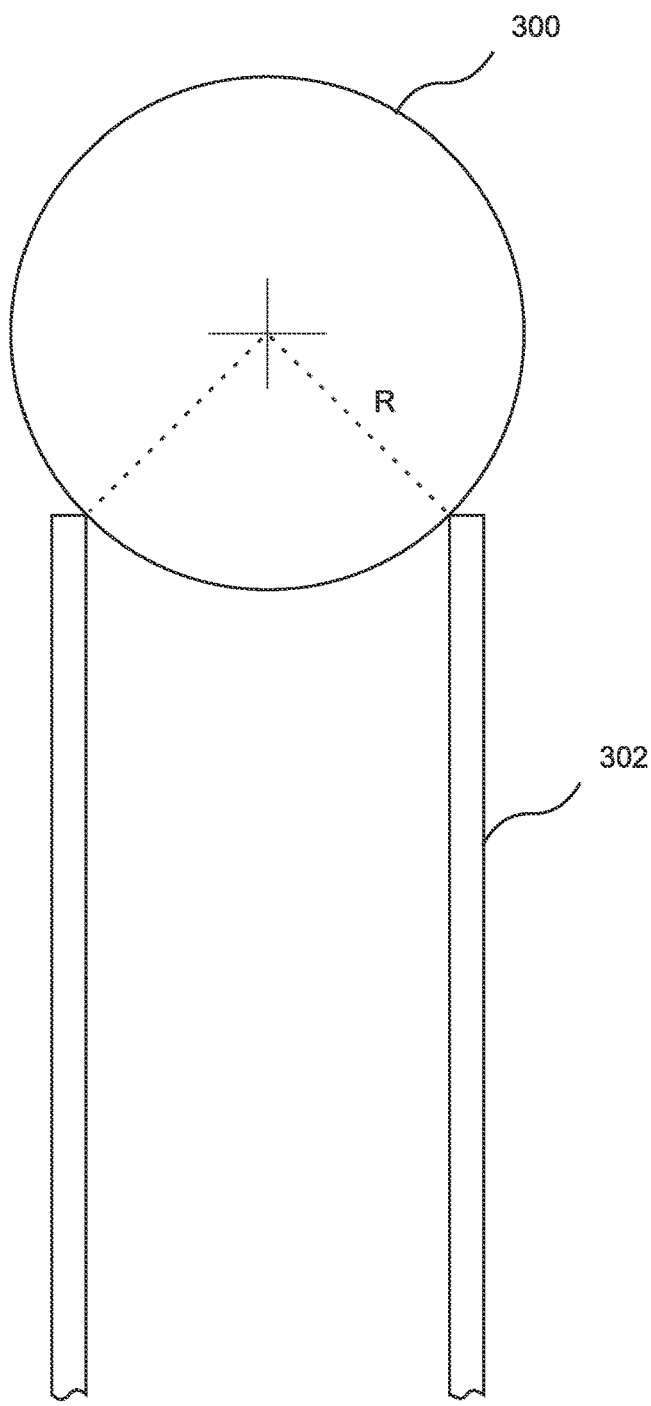
FIG. 3 is a side view illustrating an underlying concept of the present invention in embodiments where the top rims of the vertical filaments are square-cut.
Figure 4:
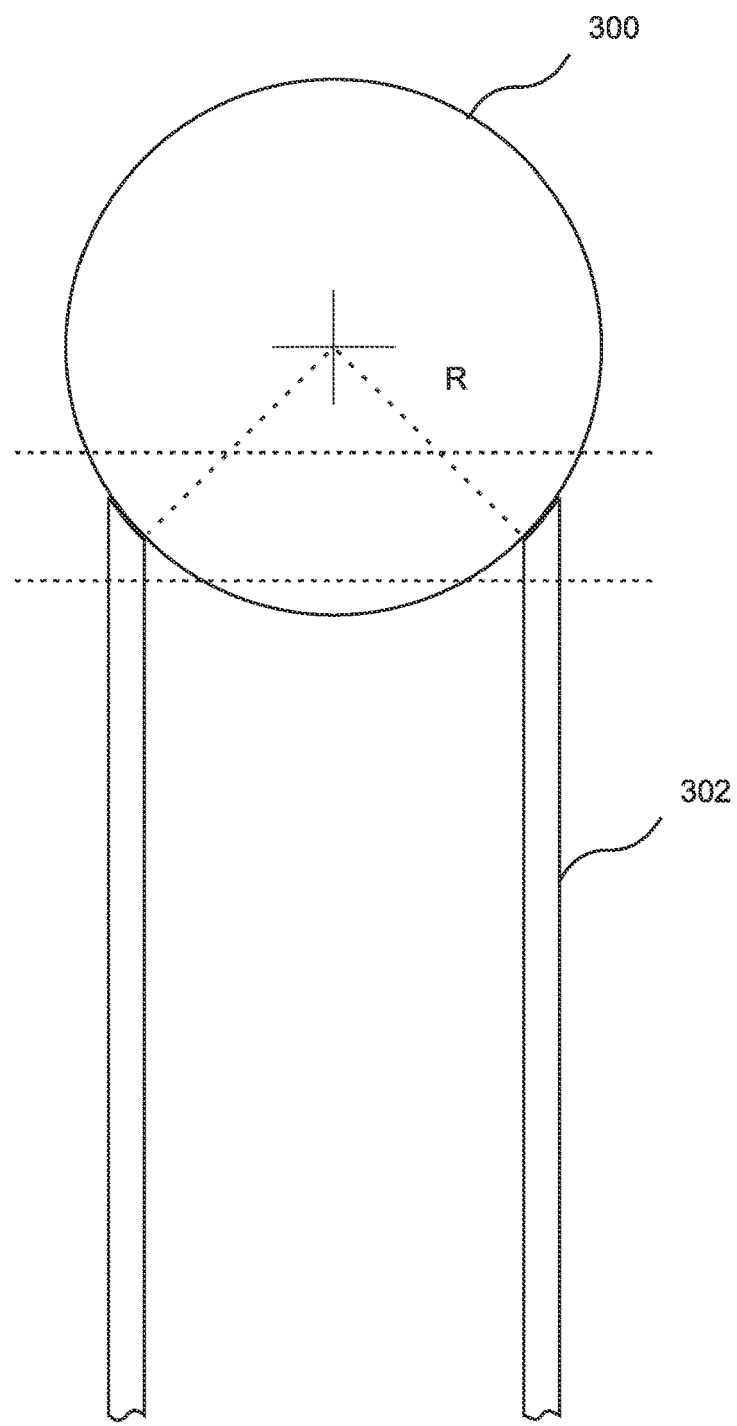
FIG. 4 is a side view illustrating an underlying concept of the present invention in embodiments where the top rims of the vertical filaments include an inwardly curved chamfer.

The basic principle of the invention is illustrated in FIG. 3, and is based on the fact that according to basic geometric principles a sphere 300 resting on the top of a tube 302 having a diameter less than the diameter 2R of the sphere 300 will form an unbroken, circular contact region with the top of the tube 302, assuming that the sphere is a perfect sphere and the cylinder is a perfect cylinder with a perfectly flat top. Due to the symmetry of the sphere, this unbroken, circular contact region will be maintained if the sphere is rotated about its center. As illustrated in FIG. 4, if the top of the cylinder is consistently chamfered inward with a shape that is compatible with the sphere, then the region of contact will be an annulus rather than a circle, and will be similarly insensitivity to the orientation of the sphere.

An embodiment of the filament assembly of the CVD reactor of the present invention that utilizes this concept to form a robust bridge-to-filament connection is illustrated in FIG. 5A. In this embodiment, an annular groove 500 is formed in the lower surface of an end of the flat horizontal bridge 502. The annular groove 500 has a curved inner wall 504 that approximates a section of a sphere, and the top of the vertical filament 302, which has a circular cross-sectional shape. Preferably, the top of filament 302 is compatibly chamfered, as shown, so that it makes an annular contact with the curved inner wall 504 of the annular groove 500, although the chamfer is not required. The size of the contact region will depend on how well matched the chamfer and the curved inner wall 504 are with each other.

Imperfections in the shaping of the chamfer and/or the top of the filament 302 may also cause small variations and/or interruptions in the contact region.

Figure 5B:
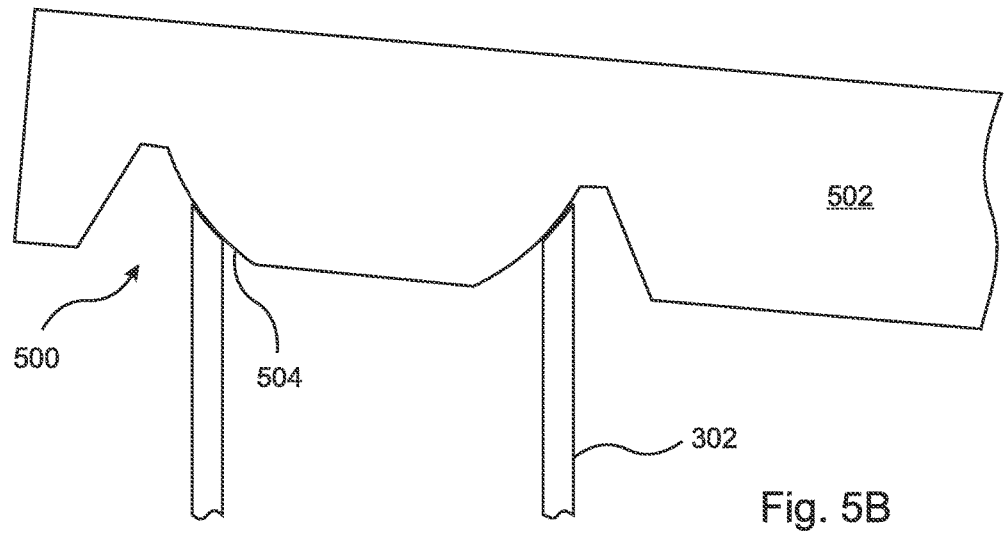
FIG. 5B is a side view of a connection between the flat horizontal bridge and the vertical filament of FIG. 5A, where the horizontal bridge has been tilted clockwise about 2 degrees.
Figure 5C:
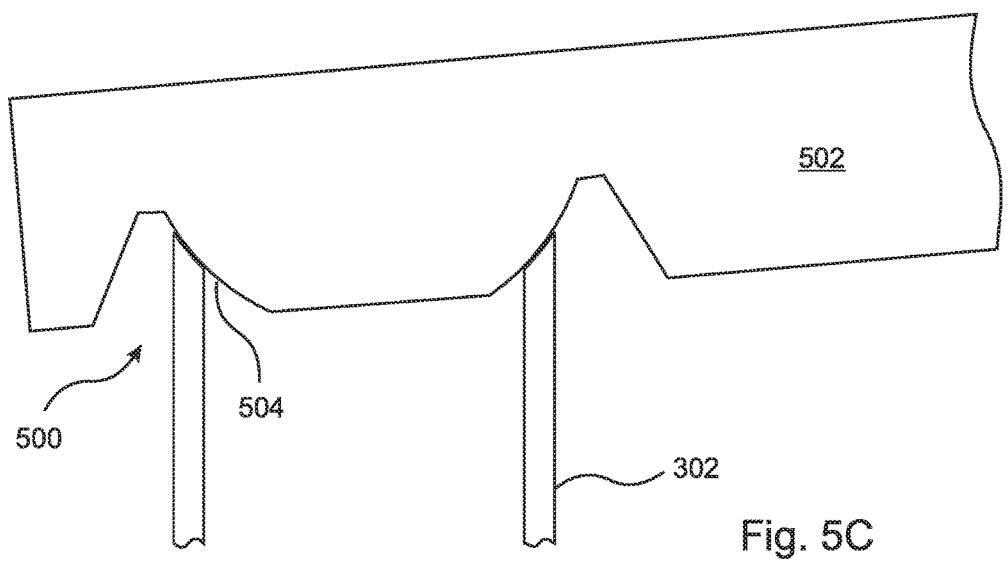
FIG. 5C is a side view of a connection between the flat horizontal bridge and the vertical filament of FIG. 5A, where the horizontal bridge has been tilted counterclockwise about 2 degrees.
Figure 6A:
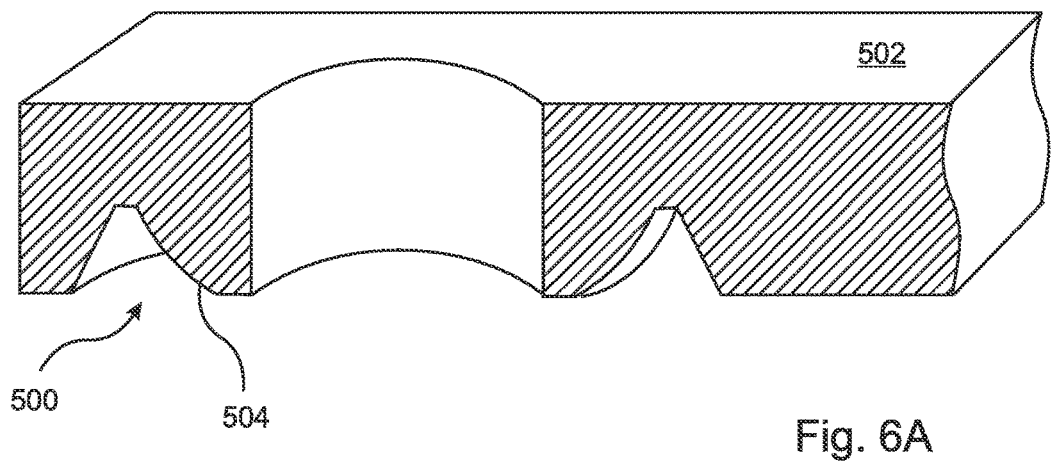
FIG. 6A is a sectional view of one end of the horizontal bridge of FIG. 5A.
Figure 6B:
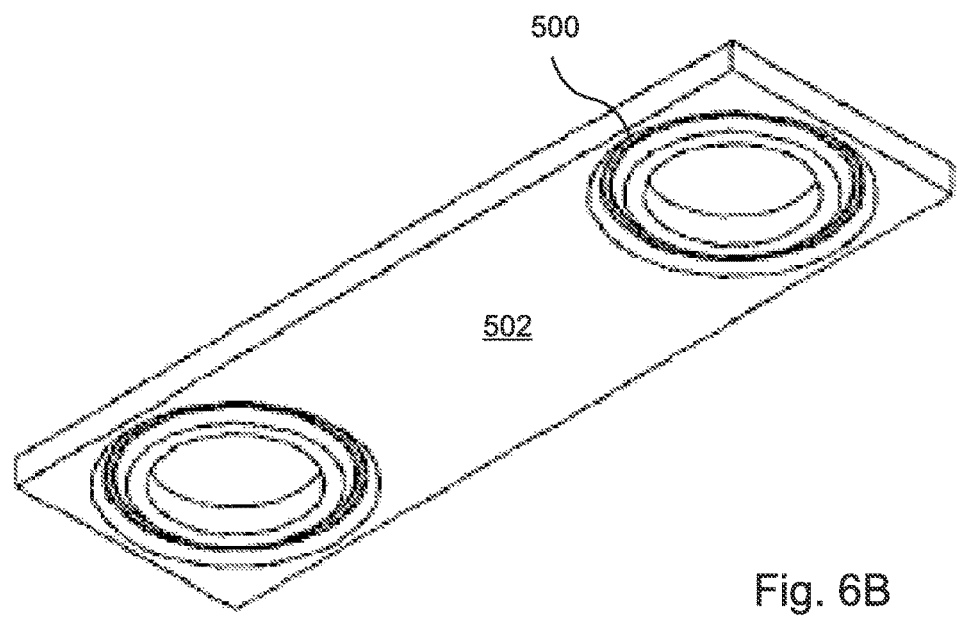
FIG. 6B is a perspective view from below of the horizontal bridge of FIG. 5A.

Regardless, if the bridge 502 and filament 302 are not precisely perpendicular to each other, the filament 302 nevertheless maintains at least 50% of the annular contact region with the inner wall 504 of the groove 500. In embodiments, 75% or even 90% of the contact region is maintained. This is illustrated in FIG. 5B and FIG. 5C, which illustrate that the contact between the filament 302 and the horizontal bridge 502 is maintained when the bridge 502 is tilted 5 degrees clockwise (FIG. 5B), or 5 degrees counterclockwise (FIG. 5C). The maximum tilt angle that can be accommodated by this embodiment is determined by the depth of the groove 500. FIG. 6A is a cut-away drawing of an end of the horizontal bridge 502 of FIG. 5A, and FIG. 6B is a perspective view from below of the horizontal bridge 502 of FIG. 5A.

Figure 7A:
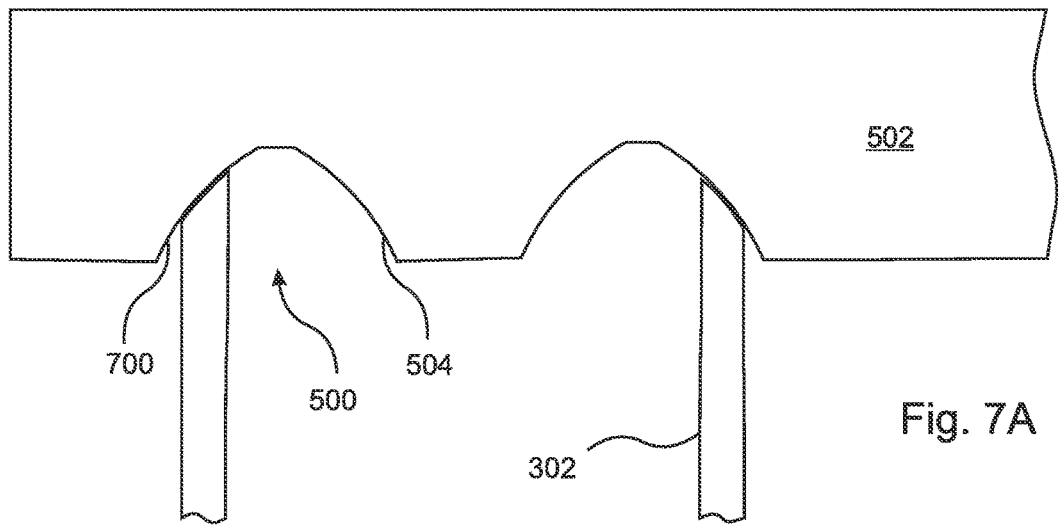
FIG. 7A is a side view of a connection between a flat horizontal bridge and the top of a vertical filament in an embodiment where a circular groove is formed in the horizontal bridge, and the outwardly chamfered top of the vertical filament rests against the outer curved wall of the circular groove.

FIG. 7A is a side view illustrating a further embodiment of the filament assembly of the CVD reactor of the present invention where the top of the filament is chamfered outward, and rests against curved outer walls 700 of a groove 500 in the horizontal bridge. In this embodiment, the curved surface 700 of the groove 500 approximates the shape of the inner surface of a section of a hollow sphere, and the chamfers are correspondingly shaped.

Figure 7B:
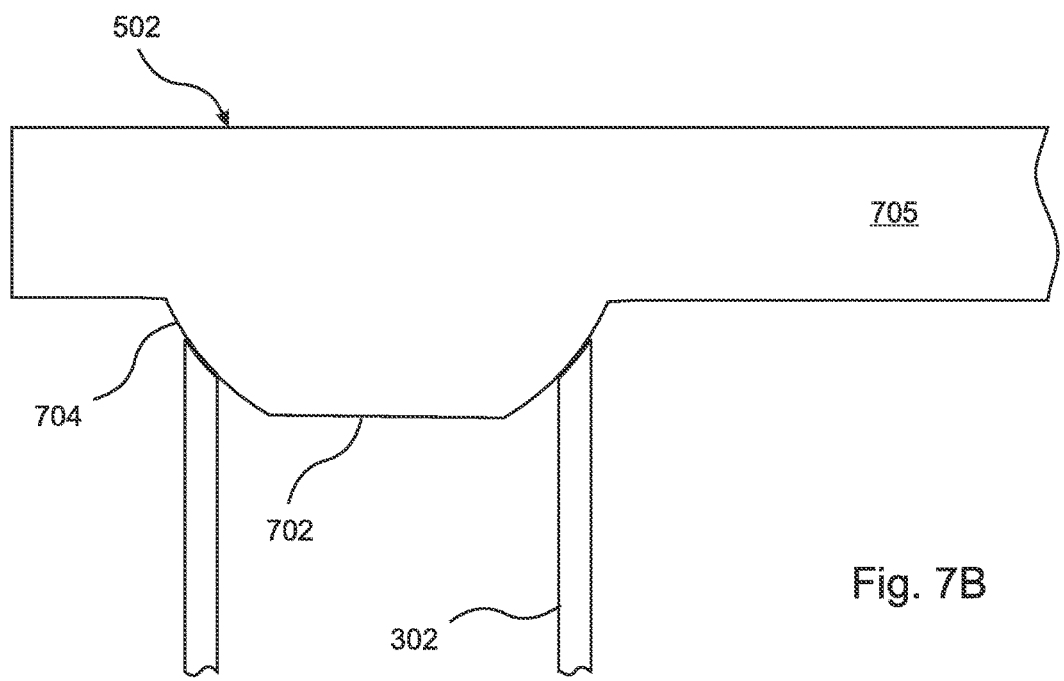
FIG. 7B is a side view of a connection between a flat horizontal bridge and the top of a vertical filament in an embodiment where a circular extension with an inwardly curved outer wall extends downward from the horizontal bridge, and the inwardly chamfered top of the vertical filament rests against the curved outer wall of the circular extension.

FIG. 7B illustrates yet another embodiment, in which the filament assembly comprises a horizontal filament bridge 502 which includes a flat section 705 and a shaped element 702 that extends downward from the flat section 705. The curved surface 704 of the shaped element 702 is shaped approximately as a section of a sphere, and forms an annular connection with the inwardly chamfered end of the vertical filament 302.

Figure 7C:
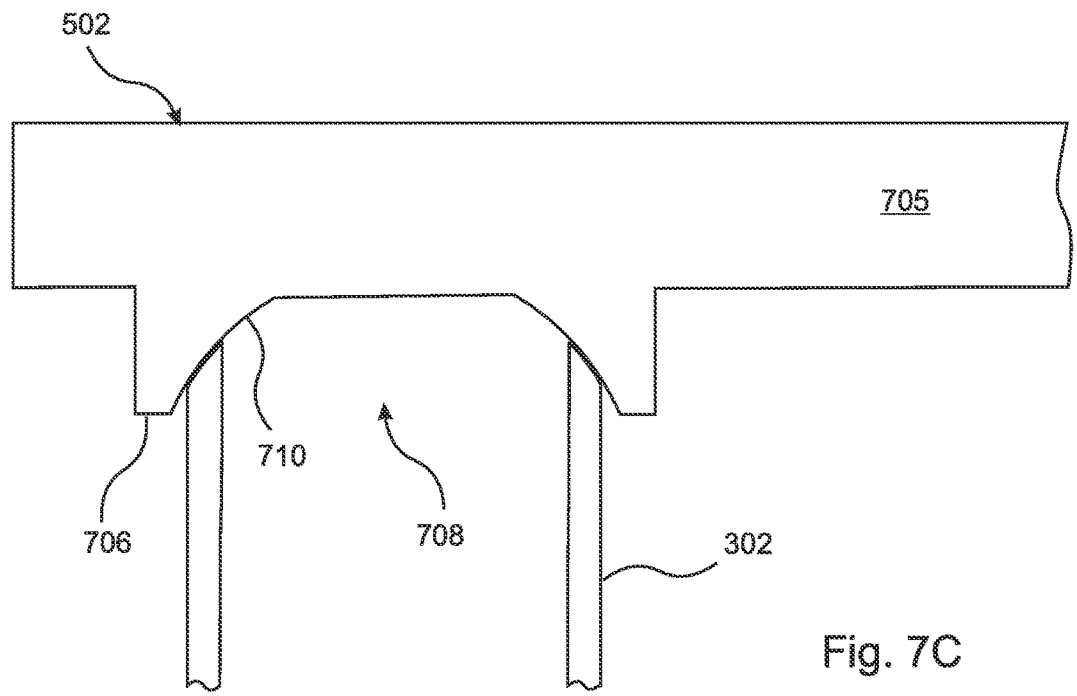
FIG. 7C is a side view of a connection between a flat horizontal bridge and the top of a vertical filament in an embodiment where a circular portion of the bridge extends downward from the horizontal bridge, the circular portion having a central recess with curved walls, and the outwardly chamfered top of the vertical filament rests against the curved outer wall of the central recess.

FIG. 7C illustrates still another embodiment, similar to FIG. 7A except that the horizontal filament bridge 502 includes a shaped element 706 extending downwardly from a flat portion 705 of the horizontal bridge 502 and having a central recess 708. The outwardly curved chamfer of the vertical filament 302 rests against the curved outer rim 710 of the recess 708, where the curved outer rim approximates the inner surface of a hollow sphere.

It should be understood that the embodiments illustrated in FIGS. 5A through 7C are not exhaustive, and that other configurations are included within the scope of the present invention.

Figure 7D:
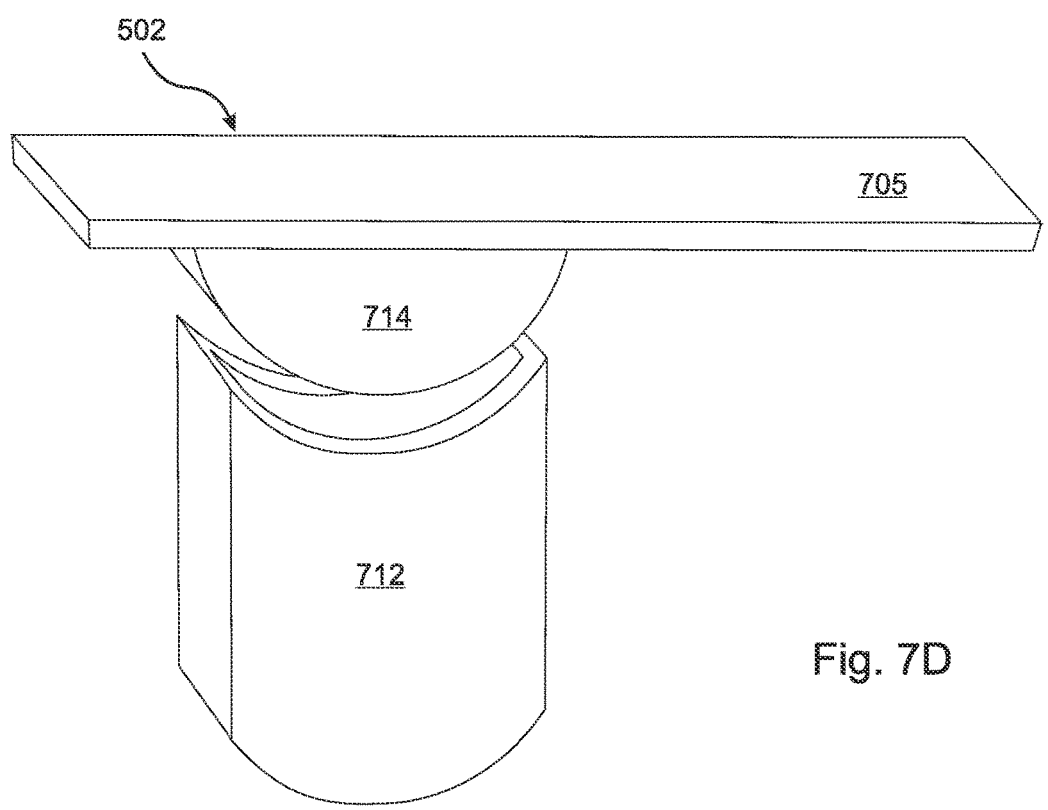
FIG. 7D is a side view of a connection between a flat horizontal bridge and the top of a vertical square tubular filament in an embodiment where a bridge extension shaped as a section of a horizontal cylinder extends downward from the bridge and rests on a curved upper rim of the rectangular tube.

It should also be understood that the present invention is not limited to connections between spherically shaped elements and vertical filament sections having a circular cross-sectional shape. For example, FIG. 7D illustrates an embodiment that includes a rectangular vertical tubular filament segment 712 having a top that is curved in the shape of a horizontal cylinder, and a horizontal filament bridge 502 having a shaped element 714 that extends downward from a flat portion 705 and approximates a section of a horizontal cylinder. It will be understood that imperfections in the sizes and alignment of the filament segments will mainly or exclusively cause tipping of the long axis of the bridge 502 relative to the central axes of the vertical segments 710, and will rarely if ever cause tipping of the short axis of the bridge 502. Accordingly, the embodiment of FIG. 7D is insensitive to tipping of the long axis of the bridge, but not to tipping of the short axis.

Figure 8:
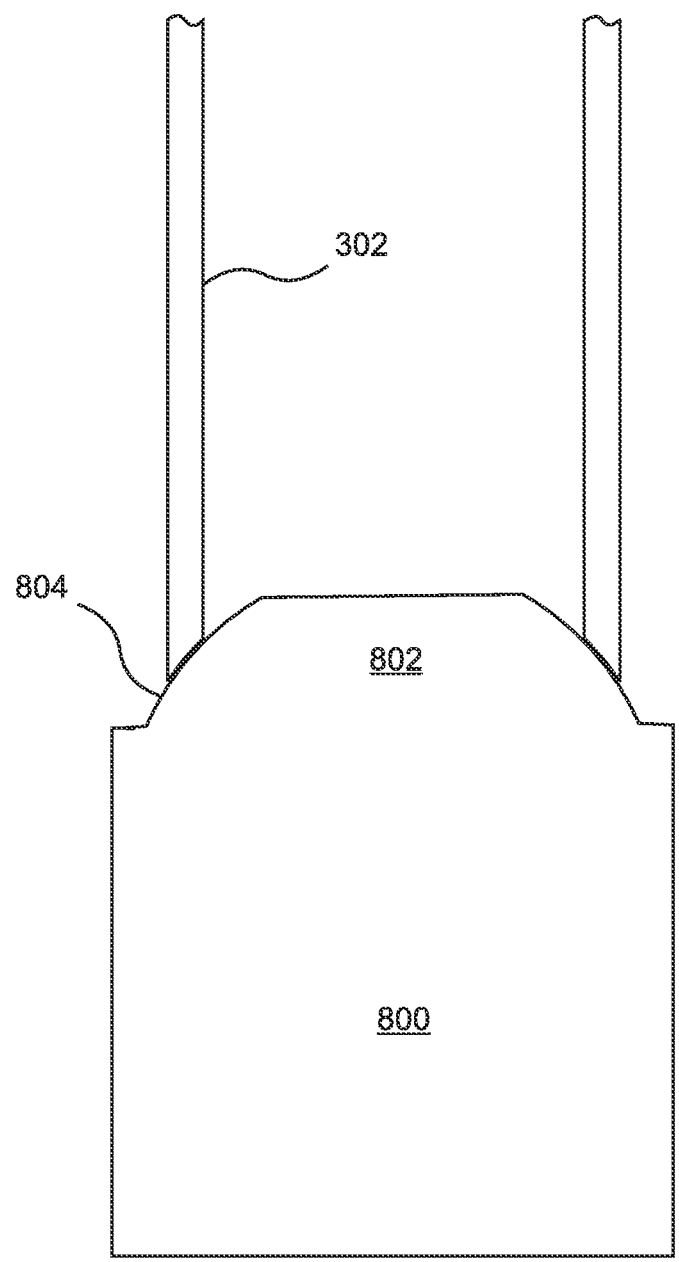
FIG. 8 is a side view of a connection between a vertical filament and a chuck, where the inwardly chamfered bottom of the vertical filament is resting on the outwardly curved surrounding wall of a circular portion of the chuck that extends upward from the chuck.
Figure 9:
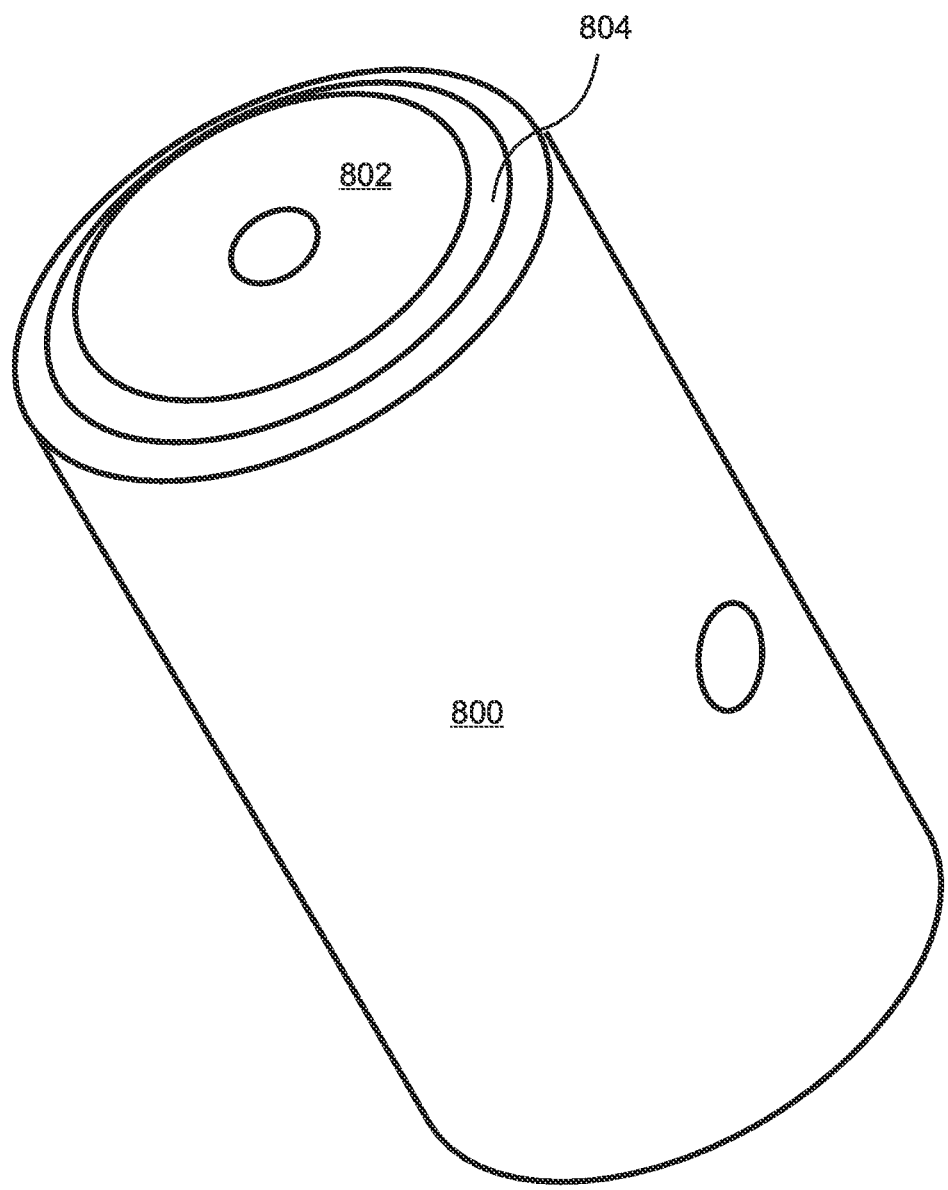
FIG. 9 is a perspective top view of the chuck of FIG. 8.

In addition, with reference to FIG. 8, it should be understood that the scope of the present invention is not limited to connections between the tops of the vertical tubular filaments 302 and the horizontal bridges 502, but also applies to connections between the bottoms of the vertical tubular filaments 302 and the filament support chucks 800. In the embodiment of FIG. 8, the chuck 800 includes a shaped element 802 that extends upward from the top of the chuck base 800. The inwardly chamfered bottom end of the vertical tubular filament 302 rests on the outer rim 804 of the shaped element 802, which is shaped as a section of a sphere. FIG. 9 is a perspective view of the chuck 800 of FIG. 8.

Also, it should be understood that embodiments of the present invention provide connections formed by contact between flat, sloped sections rather than curved sections, where the flat sloped sections are configured to approximate small sections of a sphere or cylinder.

With reference to FIG. 10A, in some embodiments of the present invention the shaped element 1000 that forms a tilt-insensitive connection with the vertical, tubular filament 302 is not incorporated into the horizontal bridge 502, but rather includes two pieces—a shaped element base 1003 and an interconnecting piece 1002. This approach helps to further combat uneven heating in the bridge 502, because the current is forced through a single connecting piece 1002 before entering the bridge 502. This provides more even heating of the tops of the cylinders, and even more uniform deposition of silicon in the region of the cylinder-to-bridge connection, further solidifying the connection. Of course, these advantages are diminished once the entire cylinder-to-bridge region is merged together due to deposition of silicon, but this approach helps to solidify the connection early in the process, and it provides a mechanism for controlling the properties of the connection by varying the standoff or length of the connecting piece 1002.

In the embodiment of FIG. 10A, the bridge 502 is connected to the shaped element 1000 by the interconnecting piece 1002 that is inserted into compatible bores in the bridge 502 and the shaped element base 1003. In this embodiment, the shaped element 1000 includes a peripheral surface 1004 on base 1003 that is curved to approximate a segment of a sphere, and the top of the vertical tubular filament 302 includes a compatible inwardly curved chamfer.

Figure 10B:
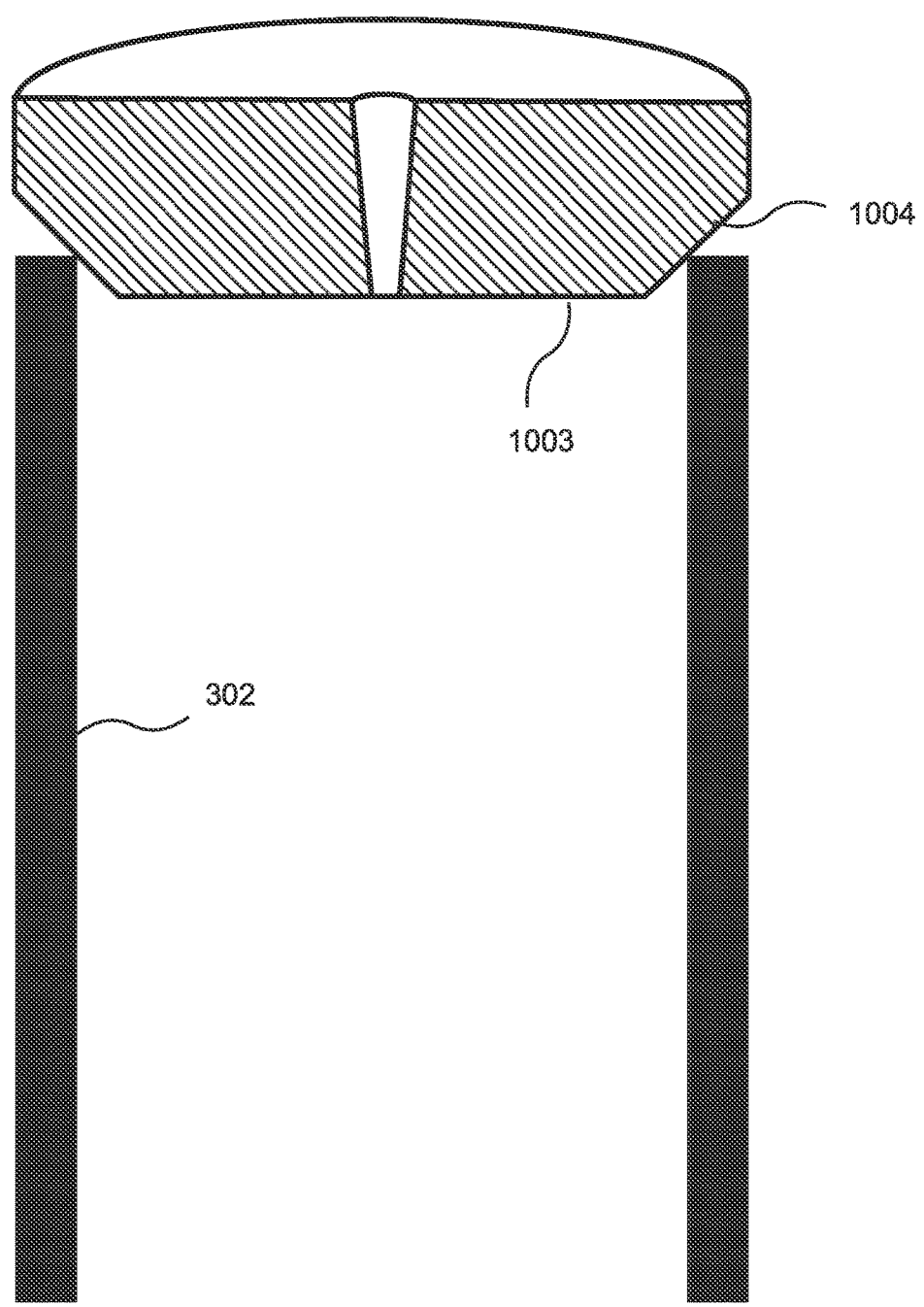
FIG. 10B is a sectional view of a shaped element having a flat, chamfered outer wall resting on the square cut top of a vertical filament.

FIG. 10B is a sectional drawing illustrating a shaped element base 1003 similar to the shaped element 1003 of FIG. 10A, but having a sloped peripheral surface 1004 that is flat. The top of the vertical tubular filament 302 in this embodiment is not chamfered, but instead includes a square-cut top that forms a circular connection with the shaped element 1000 over at least 50% of its circumference, preferably over at least 75% of its circumference, and most preferably over 90% of its circumference.

Figure 11:
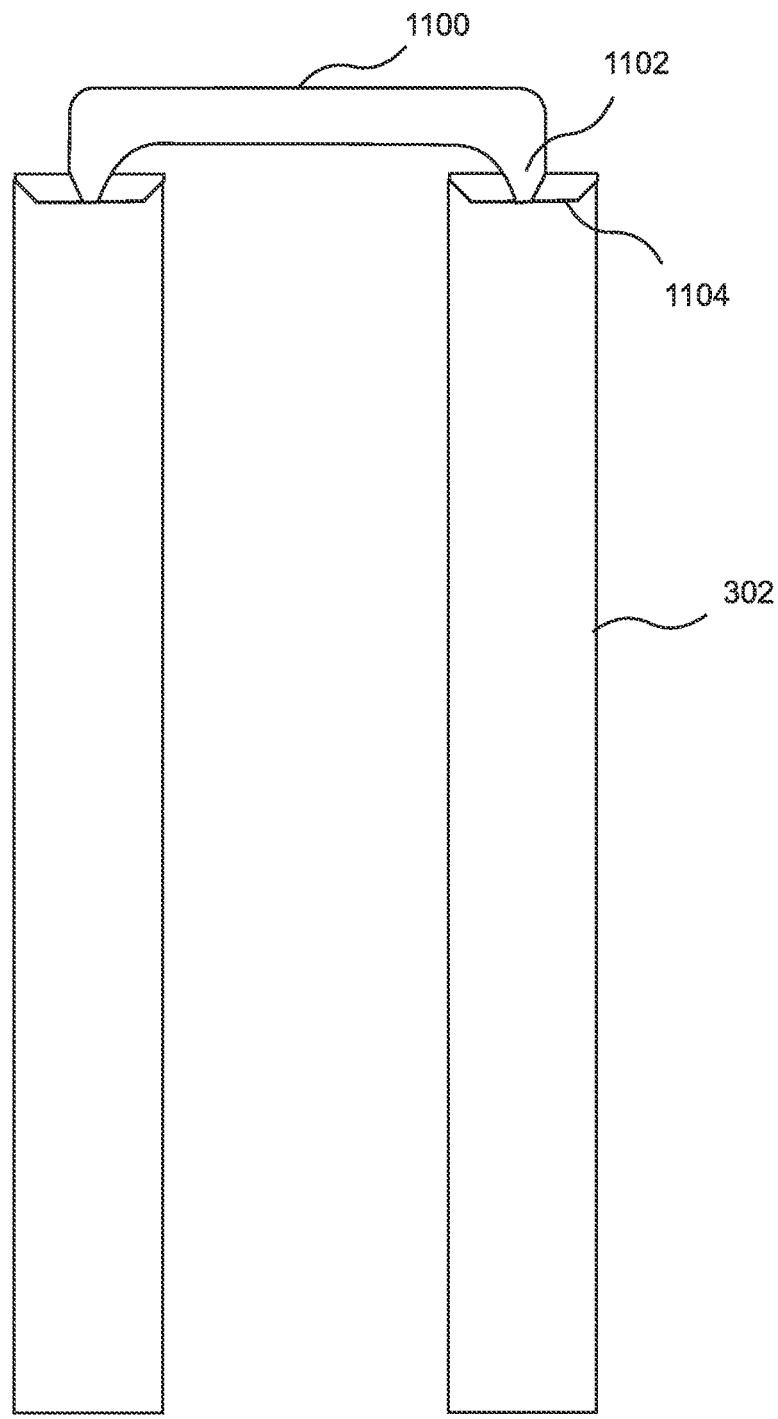
FIG. 11 is a side view of a pair of vertical filaments with the curved outer walls of shaped elements resting on their inwardly chamfered tops, the shaped elements being connected directly to a horizontal bridge by connecting segments that extend downward from the horizontal bridge.

FIG. 11 is a side illustration of an embodiment wherein conical elements 1102 are incorporated into the horizontal bridge 1100 and extend downward so that they can be inserted into bores in the shaped elements 1104. This approach includes shaped elements 1104 that are separate from the bridge 1100, while eliminating the need for interconnecting pieces.

Figure 12A:
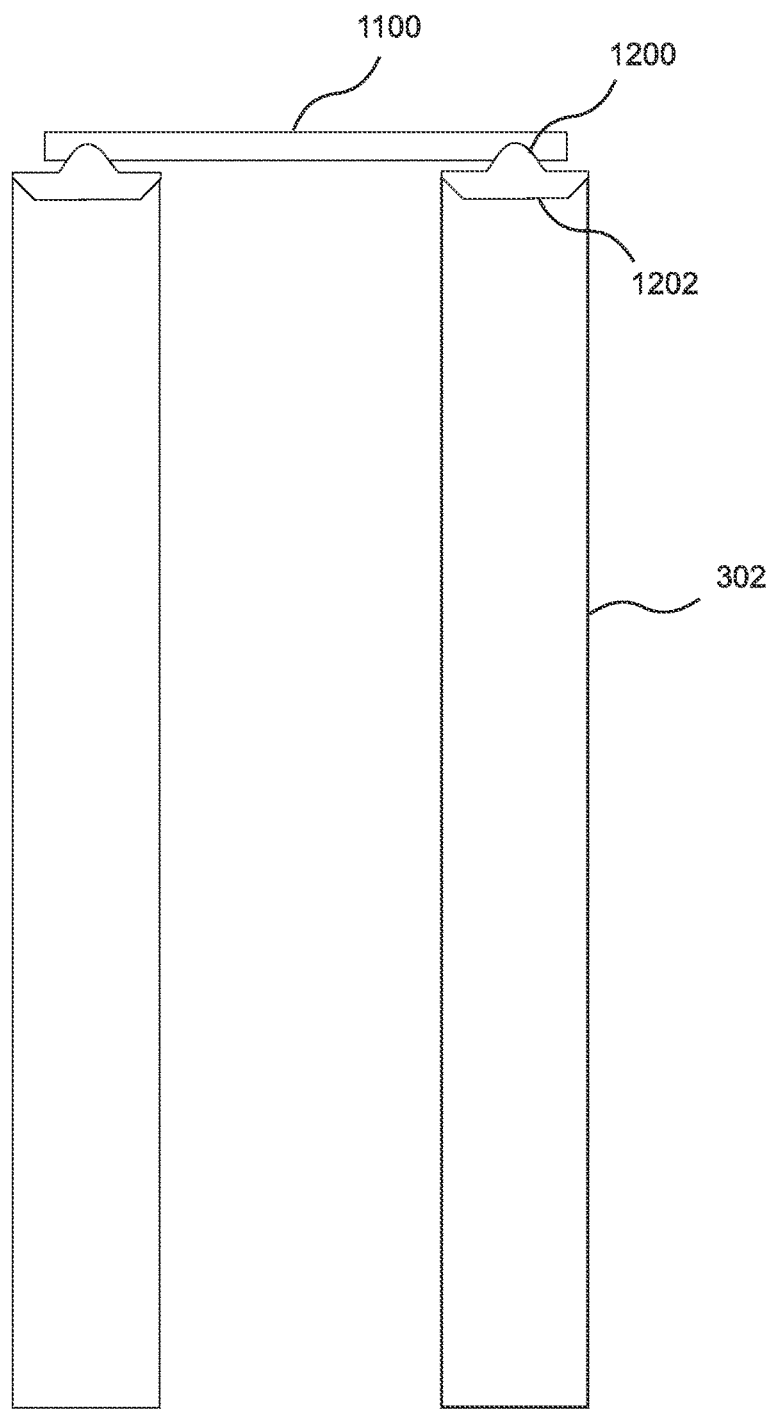
FIG. 12A is a side view of an embodiment similar to FIG. 11, except that the horizontal bridge is directly connected to the shaped elements by contact between rounded raised extensions of the shaped elements and curved indentations in the ends of the horizontal bridge.
Figure 12C:
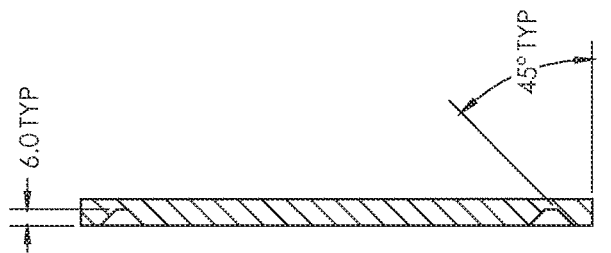
FIGS. 12B through 12D are drawn-to-scale side, bottom, side sectional and end views respectively of the horizontal bridge of FIG. 12A.
Figure 12C:
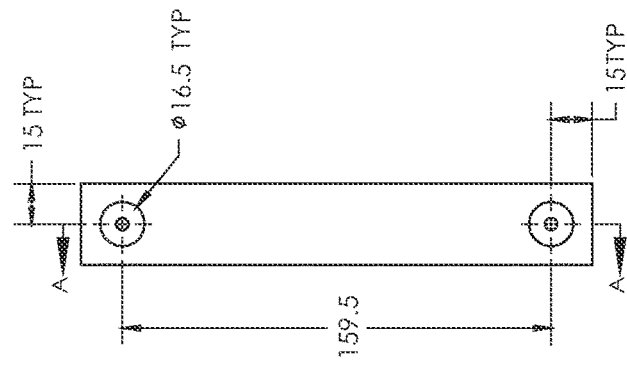
Figure 12D:
Figure 12B:
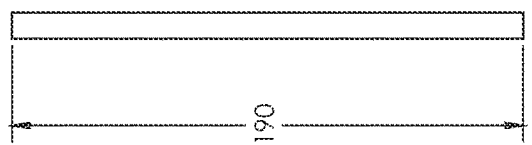

FIG. 12A is a side illustration of an embodiment similar to FIG. 11, except that shaped recesses provided in the ends of the bridge 1100 rest on compatible rounded extensions 1200 incorporated into the tops of the shaped elements 1202. Essentially, the embodiments illustrated by FIG. 11 and FIG. 12A differ in that the bridge in FIG. 11 includes male features 1102 that connect with female features in the shaped elements 1104, while the bridge in FIG. 12A includes female features that connect with male features 1200 in the shaped elements 1202.

Figure 12G:
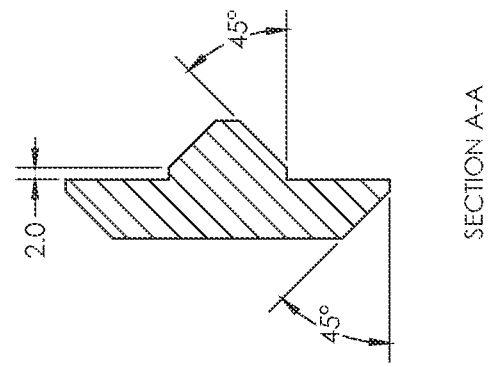
FIGS. 12F through 12H are bottom, cutaway, and drawn-to-scale side views respectively of the shaped elements of FIG. 12A.
Figure 12F:
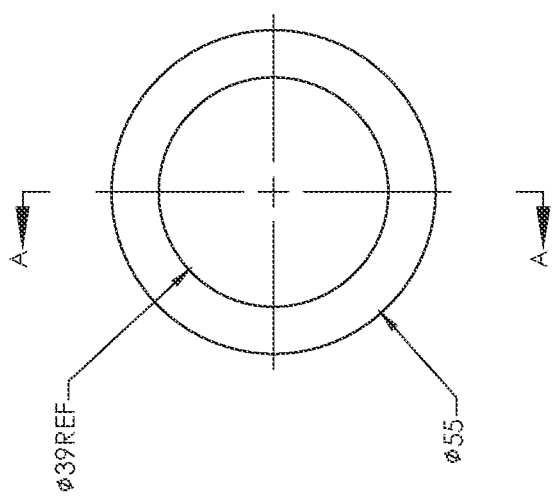
Figure 12H:
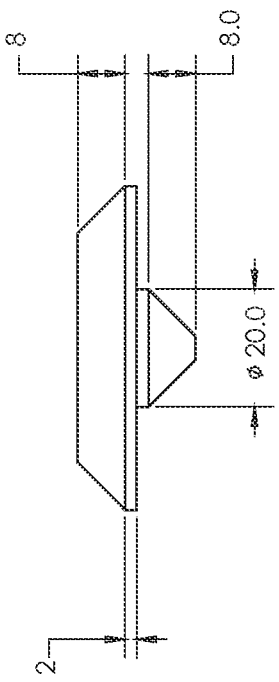

FIGS. 12B through 12E are illustrations drawn to scale that show a side view (12B), bottom view (12C), end view 12(D), and cutaway side view (12E) of a bridge that is similar to the bridge 1100 of FIG. 12A, except that the recesses include sloped, flat sides instead of curved sides. FIGS. 12F through 12H are illustrations drawn to scale that show a top view (12F), cutaway side view (12G), and side view (12H) of a shaped element that is compatible with the bridge of FIGS. 12B through 12E.

In embodiments, the shaped elements 1000 of FIG. 12A are molded onto the top ends of the vertical filaments 302, and tilt angles between the bridge 1100 and the vertical filaments are accommodated by a sliding connection between the tops of the shaped elements 1200 and compatible structures formed in the bridge 1100.

Figure 13B:
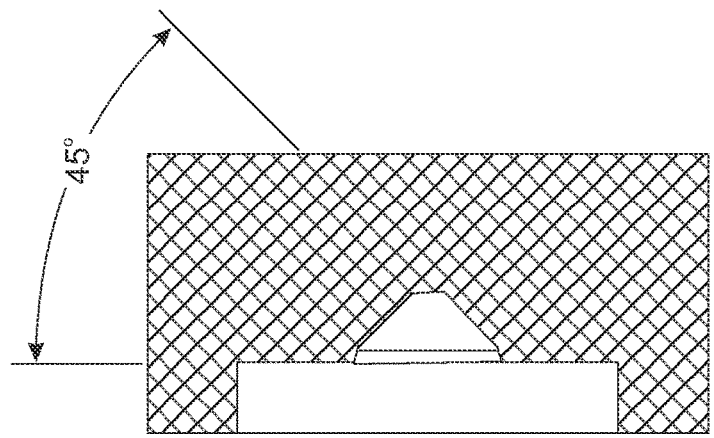
FIGS. 13A and 13B are top and sectional side drawn-to-scale views respectfully of a mold crucible suitable for forming a shaped element similar to FIGS. 12F through 12H.
Figure 13A:
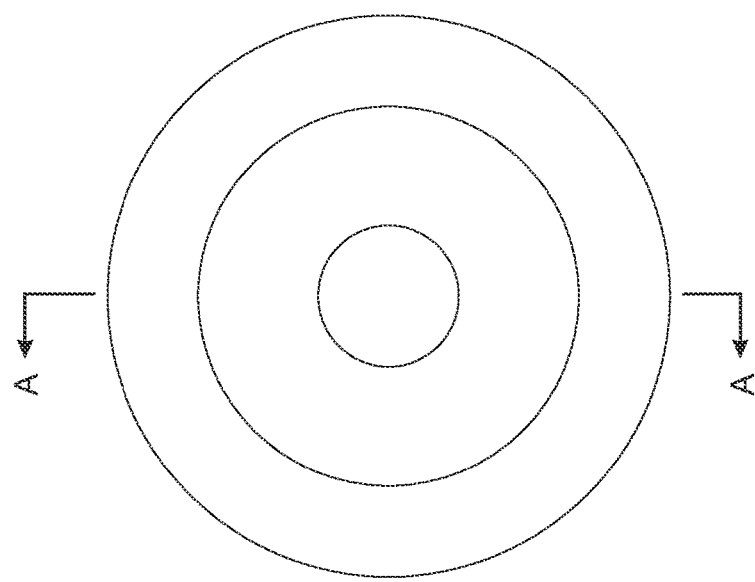
Figure 13D:
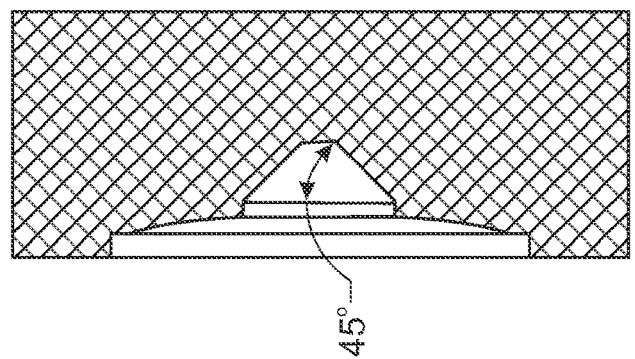
FIGS. 13C and 13D are top and sectional side drawn-to-scale views respectfully of a mold crucible similar to FIGS. 13A and 13B, but having a thinner base.
Figure 13C:
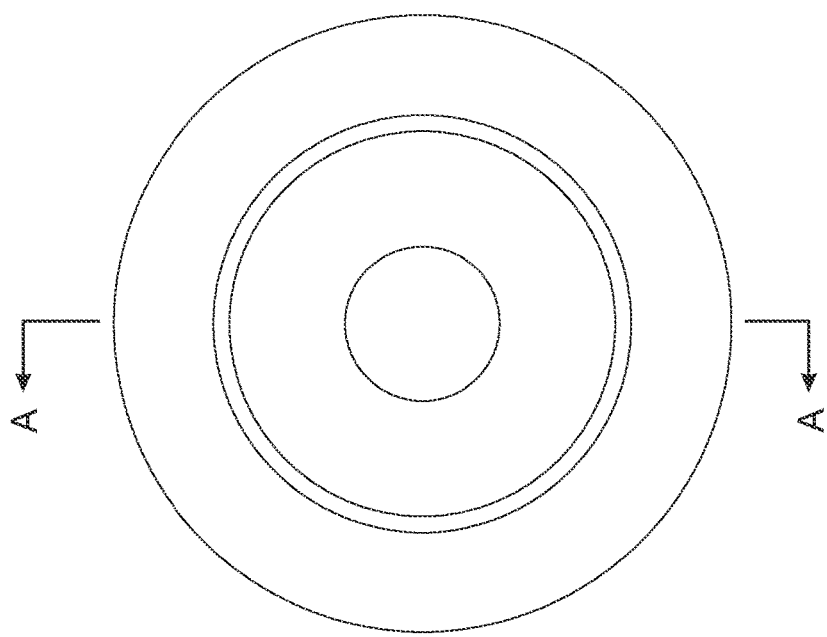

FIGS. 13A and 13B are illustrations drawn to scale that show a top view (13A) and a sectional side view (13B) of a crucible suitable for forming a shaped element similar to FIGS. 12F through 12H. FIGS. 13C and 13D are illustrations drawn to scale that show a top view (13A) and a sectional side view (13B) of a crucible similar to FIGS. 13A and 13B, but configured for forming a shaped element having a thinner base.

Figure 13E:
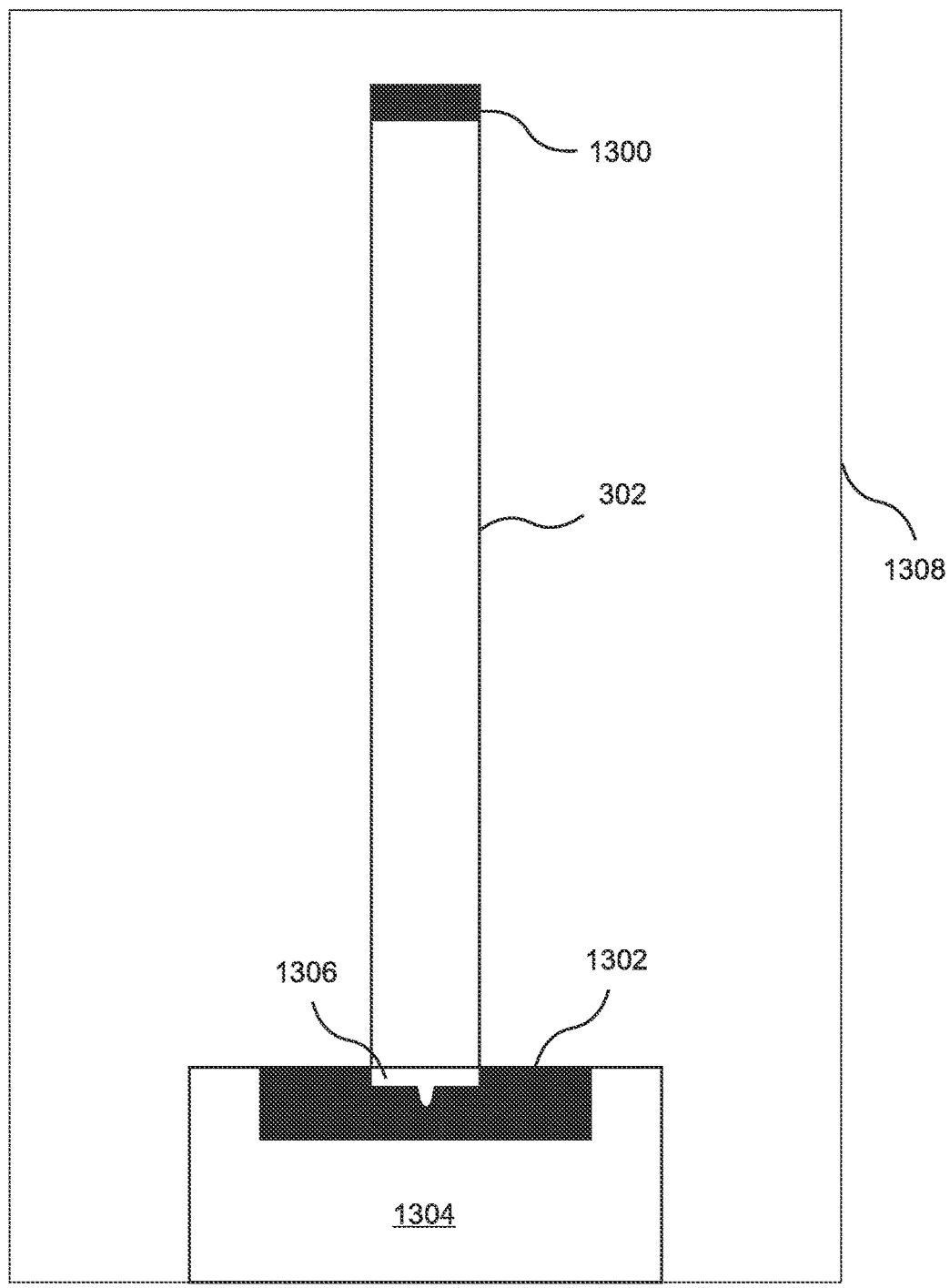
FIG. 13E is a side view of a vertical filament attached at the top to a filament seed and lowered into the mold of FIGS. 13A and 13B so that a shaped element can be formed directly on an end of the filament.

FIG. 13E is a side view of a vertical filament 302 attached at one end to a filament seed 1300. The filament has been lowered into the mold 1302 of FIGS. 13A and 13B, and the mold 1302 has been filled with a molten material, such as silicon, heated by a hot zone surrounding the mold 1302 so that a shaped element 1306 can be formed directly on the end of the filament 302. The entire assembly is surrounded by a tube furnace 1308.

Figure 13F:
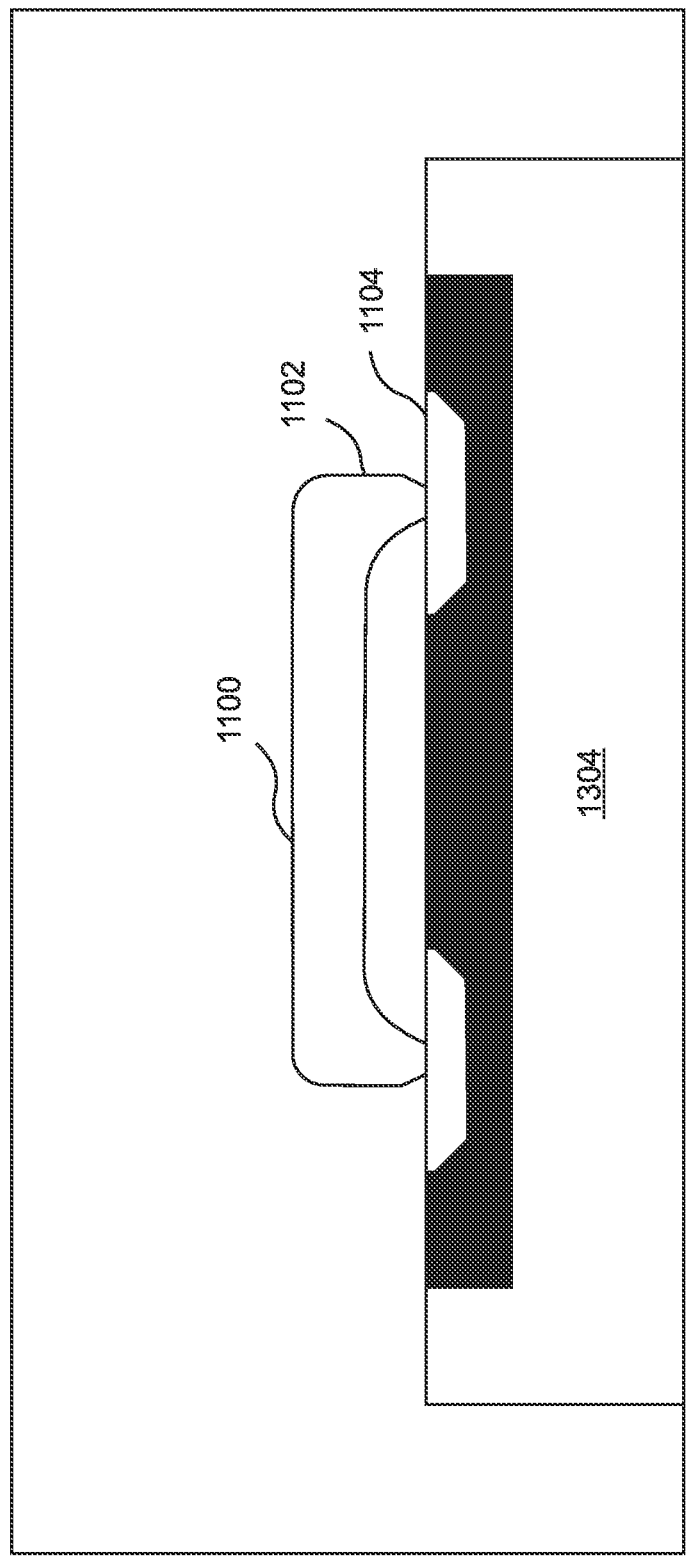
FIG. 13F is a side view of a horizontal bridge having its ends lowered into a mold so that shaped elements can be formed directly on the ends of the bridge.

Similarly, FIG. 13F is a side view of a bridge 1100 similar to the bridge 1100 in FIG. 11, both ends of which have been lowered into a mold 1302 filled with a molten material, such as silicon, heated by a hot zone surrounding the mold 1302, so that shaped elements 1104 can be formed directly on the ends of the bridge 1100. The entire assembly is surrounded by a tube furnace 1308. In similar embodiments, the shaped elements are formed as part of the bridge using a process such as molding or machining.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

We claim:

1. A CVD reactor for bulk production of polysilicon, comprising:
    a base plate configured with a first filament support chuck and a second filament support chuck;
    an enclosure attachable to said base plate so as to form a deposition chamber; and
    a filament assembly comprising:
        a first tubular silicon filament, said first tubular silicon filament being vertically oriented and having a bottom end making an electrical connection with said first filament support chuck;
        a second tubular silicon filament, said second tubular silicon filament being vertically oriented and having a bottom end making an electrical connection with said second filament support chuck, said first and second tubular silicon filaments being non-concentric;
        a horizontal bridge configured for electrically connecting top ends of said first and second tubular silicon filaments, such that current flowing between the first and second tubular filaments is required to flow through the bridge;
        a first shaped element forming an electrical connection between the horizontal bridge and the top of the first tubular filament, said first shaped element having a first peripheral surface surrounding a substantially vertical central axis of the first shaped element, said first peripheral surface being slanted or curved so as to form a first region of contact that is slidable against a perimeter of said top end of said first tubular silicon filament when said first peripheral surface is placed adjacent to said top end of the first tubular silicon filament and an angle between the vertical central axis of the first shaped element and a vertical central axis of the first tubular silicon filament is varied;
        said first peripheral surface being configured to maintain at least 50% of said first region of contact when the angle between the central axis of the first shaped element and the central axis of the first tubular silicon filament is varied up to a maximum tilt angle; and
        a second shaped element forming an electrical connection between the horizontal bridge and the top of the second tubular filament, said second shaped element having a second peripheral surface surrounding a substantially vertical central axis of the second shaped element, said second peripheral surface being slanted or curved so as to form a second region of contact that is slidable against a perimeter of said top end of said second tubular silicon filament when said second peripheral surface is placed adjacent to said top end of the second tubular silicon filament and an angle between the vertical central axis of the second shaped element and a vertical central axis of the second tubular silicon filament is varied;
        said second peripheral surface being configured to maintain at least 50% of said second region of contact when the angle between the central axis of the second shaped element and the central axis of the second tubular silicon filament is varied up to a maximum tilt angle.

2. The CVD reactor of claim 1, wherein the first tubular silicon filament has a cross section shaped as a circular annulus.

3. The filament assembly of claim 1, wherein said first and second shaped elements are male elements in electrical communication with first and second ends, respectively, of said horizontal bridge, said first and second peripheral surfaces being slanted or curved outward to rest on inner perimeters of the tops of the first and second tubular silicon filaments.

4. The filament assembly of claim 1, wherein said first shaped element is a female element in electrical communication with a first end of said horizontal bridge, said first peripheral surface being slanted or curved inward to rest on an outer perimeter of the top of the first tubular silicon filament.

5. The filament assembly of claim 1, wherein the top end of the first tubular silicon filament includes a chamfer that is slanted or curved so as to be compatible with the first peripheral surface of the first shaped element for said first slidable region of contact.

6. The CVD reactor of claim 1, wherein the first shaped element is incorporated into the horizontal bridge.

7. The CVD reactor of claim 1 wherein the first shaped element is recessed into a lower surface of a first end of the horizontal bridge.

8. The CVD reactor of claim 1, wherein the first peripheral surface of the first shaped element is a wall of a groove formed in a lower surface of a first end of the horizontal bridge.

9. The CVD reactor of claim 1, wherein the first shaped element extends below a lower surface of the horizontal bridge.

10. The CVD reactor of claim 1, wherein the first peripheral surface is a sloped, substantially flat surface.

11. The CVD reactor of claim 1, wherein the first peripheral surface is shaped as a section of a sphere taken perpendicular to a diameter of the sphere.

12. The CVD reactor of claim 1, wherein an angle between the first peripheral surface and the central axis of the first shaped element is approximately 45 degrees.

13. The CVD reactor of claim 1, wherein the first tubular silicon filament has a cross section shaped as a hollow rectangle.

14. The CVD reactor of claim 1, wherein the first shaped element includes a separate component, distinct from the bridge and the tubular silicon filaments.

15. The CVD reactor of claim 14, wherein the separate component is in direct physical contact with the horizontal bridge or the first tubular silicon filament.

16. The CVD reactor of claim 1, wherein said first peripheral surface is configured to maintain at least 75% of said first region of contact when the angle between the central axis of the first shaped element and the central axis of the first tubular silicon filament is varied up to the maximum tilt angle.

17. The CVD reactor of claim 1, wherein said first peripheral surface is configured to maintain at least 90% of said region of contact when the angle between the central axis of the first shaped element and the central axis of the first tubular silicon filament is varied up to a maximum tilt angle.

18. A filament assembly configured for bulk production of polysilicon in a CVD reactor, said CVD reactor including a base plate configured with a first filament support chuck and a second filament support chuck, said filament assembly comprising:
   a first tubular silicon filament, said first tubular silicon filament being vertically oriented and having a bottom end configured to make an electrical connection with said first filament support chuck;
   a second tubular silicon filament, said second tubular silicon filament being vertically oriented and having a bottom end configured to make an electrical connection with said second filament support chuck, said first and second tubular silicon filaments being non-concentric;
   a horizontal bridge configured for electrically connecting top ends of said first and second tubular silicon filaments, such that current flowing between the first and second tubular filaments is required to flow through the bridge;
   a first shaped element proximal to a first end of said horizontal bridge and forming an electrical connection between the horizontal bridge and the top of the first tubular filament, the first shaped element having a first peripheral surface surrounding a substantially vertical central axis of the first shaped element, said first peripheral surface being slanted or curved so as to form a first region of contact that is slidable against a perimeter of said top end of said first tubular silicon filament when said first peripheral surface is placed on top of said first tubular silicon filament and an angle between the vertical central axis of the first shaped element and a vertical central axis of the first tubular silicon filament is varied;
   said first peripheral surface being configured to maintain at least 50% of said first region of contact when an angle between the vertical central axis of the first shaped element and a vertical central axis of the first tubular silicon filament is varied up to a maximum tilt angle; and
   a second shaped element proximal to a second end of said horizontal bridge and forming an electrical connection between the horizontal bridge and the top of the second tubular filament, the second shaped element having a second peripheral surface surrounding a substantially vertical central axis of the second shaped element, said second peripheral surface being slanted or curved so as to form a second region of contact that is slidable against a perimeter of said top end of said second tubular silicon filament when said second peripheral surface is placed on top of said second tubular silicon filament and an angle between the vertical central axis of the second shaped element and a vertical central axis of the second tubular silicon filament is varied;
   said second peripheral surface being configured to maintain at least 50% of said second region of contact when an angle between the vertical central axis of the second shaped element and a vertical central axis of the second tubular silicon filament is varied up to a maximum tilt angle.

19. The filament assembly of claim 18, wherein the first tubular silicon filament has a cross section shaped as a circular annulus.

20. The filament assembly of claim 18, wherein said first shaped element is a male element, said first peripheral surface being slanted or curved outward to rest on an inner perimeter of the top of the first tubular silicon filament.

21. The filament assembly of claim 18, wherein said first shaped element is a female element, said first peripheral surface being slanted or curved inward to rest on an outer perimeter of the top of the first tubular silicon filament.

22. The filament assembly of claim 18, wherein the top end of the first tubular silicon filament includes a perimeter that is slanted or curved so as to be compatible with the first peripheral surface of the first shaped element for said first slidable region of contact.

23. The filament assembly of claim 18, wherein the first tubular silicon filament has a cross section shaped as a hollow rectangle.

24. The filament assembly of claim 18, wherein the top end of the first tubular silicon filament is shaped as a horizontal, flat annulus.

25. The filament assembly of claim 18, wherein the first shaped element is a separate component, distinct from the tubular silicon filaments and the horizontal bridge.

26. The filament assembly of claim 18, wherein said first peripheral surface is configured to maintain at least 75% of said first region of contact when the angle between the central axis of the first shaped element and the central axis of the first tubular silicon filament is varied up to a maximum tilt angle.

27. The filament assembly of claim 18, wherein said first peripheral surface is configured to maintain at least 90% of said first region of contact when the angle between the central axis of the first shaped element and the central axis of the first tubular silicon filament is varied up to a maximum tilt angle.

28. A horizontal filament bridge configured for electrically connecting top ends of a first vertical tubular silicon filament and a second vertical tubular silicon filament in a CVD reactor, such that current flowing between the first and second tubular filaments is required to flow through the bridge, said first and second tubular silicon filaments being non-concentric, said horizontal filament bridge comprising:
- a horizontal bridge;
- a first shaped element proximal to a first end of the horizontal bridge and forming an electrical connection between the horizontal bridge and the top of the first tubular filament, the first shaped element having a first peripheral surface surrounding a substantially vertical central axis of the first shaped element, said first peripheral surface being slanted or curved so as to form a first region of contact that is slidable against a perimeter of said top of the first tubular silicon filament when said first peripheral surface is placed on top of said first tubular silicon filament and an angle between the vertical central axis of the first shaped element and a vertical central axis of the first tubular silicon filament is varied;
- said first peripheral surface being configured to maintain at least 50% of said first region of contact when an angle between the vertical central axis of the first shaped element and a vertical central axis of the first tubular silicon filament is varied up to a maximum tilt angle; and
- a second shaped element proximal to a second end of the horizontal bridge and forming an electrical connection between the horizontal bridge and the top of the second tubular filament, the second shaped element having a second peripheral surface surrounding a substantially vertical central axis of the second shaped element, said second peripheral surface being slanted or curved so as to form a second region of contact that is slidable against a perimeter of said top of the second tubular silicon filament when said second peripheral surface is placed on top of said second tubular silicon filament and an angle between the vertical central axis of the second shaped element and a vertical central axis of the second tubular silicon filament is varied;
- said second peripheral surface being configured to maintain at least 50% of said second region of contact when an angle between the vertical central axis of the second shaped element and a vertical central axis of the second tubular silicon filament is varied up to a maximum tilt angle.

29. The horizontal filament bridge of claim 28, wherein said first shaped element is a male element, said first peripheral surface being slanted or curved inward to rest on an inner perimeter of the top of the first tubular silicon filament.

30. The horizontal filament bridge of claim 28, wherein said first shaped element is a female element, said first peripheral surface being slanted or curved inward to rest on an outer perimeter of the top of the first tubular silicon filament.

31. The horizontal filament bridge of claim 28, wherein the first shaped element is incorporated into the horizontal bridge.

32. The horizontal filament bridge of claim 28, wherein the first shaped element includes a separate component, distinct from the horizontal bridge.

33. The horizontal filament bridge of claim 28, wherein the first tubular silicon filament has a cross section shaped as a circular annulus.

34. The horizontal filament bridge of claim 28, wherein said first peripheral surface is configured to maintain at least 75% of said first region of contact when the angle between the central axis of the first shaped element and the central axis of the first tubular silicon filament is varied up to a maximum tilt angle.

35. The horizontal filament bride of claim 28, wherein said first peripheral surface is configured to maintain at least 90% of said region of contact when the angle between the central axis of the first shaped element and the central axis of the first tubular silicon filament is varied up to a maximum tilt angle.

* * * * *